US012604764B2

(12) United States Patent
Kim et al.

(10) Patent No.:  US 12,604,764 B2
(45) Date of Patent:       Apr. 14, 2026

(54) DISPLAY DEVICE AND METHOD OF FABRICATING THE SAME

(71) Applicant: Samsung Display Co., LTD., Yongin-si (KR)

(72) Inventors: Jeong Nyun Kim, Yongin-si (KR); Sung Geun Bae, Yongin-si (KR); Jeong Hyun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 811 days.

(21) Appl. No.: 17/697,208

(22) Filed: Mar. 17, 2022

(65) Prior Publication Data

US 2022/0367433 A1      Nov. 17, 2022

(30) Foreign Application Priority Data

May 12, 2021    (KR) ......................... 10-2021-0061608

(51) Int. Cl.
H01L 25/16        (2023.01)
H01L 23/00        (2006.01)
          (Continued)

(52) U.S. Cl.
CPC ............ H01L 25/167 (2013.01); H01L 24/24 (2013.01); H10D 86/021 (2025.01);
          (Continued)

(58) Field of Classification Search
CPC .................. H01L 25/167; H01L 24/95; H01L 2224/24051; H01L 2224/24147; H01L 2224/244; H01L 2224/95133; H10D 86/441; H10D 86/60; H10D 86/021; H10H 20/857
See application file for complete search history.

(56) References Cited

U.S. PATENT DOCUMENTS 10,522,718 B2    12/2019  Tangring
2018/0175106 A1*   6/2018  Kim ...................... H01L 25/167
                (Continued)

FOREIGN PATENT DOCUMENTS

EP          3608958        2/2020
KR    10-2020-0088948        7/2020
                (Continued)

*Primary Examiner* — Shaun M Campbell
(74) *Attorney, Agent, or Firm* — Womble Bond Dickinson (US) LLP

(57)          ABSTRACT

A display device may include pixels, each of the pixels including first and second lower electrodes disposed on a substrate; first and second upper electrodes respectively disposed on the first and second lower electrodes; a first insulating layer including a first contact hole exposing a portion of the first lower electrode, and a second contact hole exposing a portion of the second lower electrode; a first pixel electrode disposed on the first insulating layer, and contacting the first lower electrode through the first contact hole; a second pixel electrode disposed on the first insulating layer, and contacting the second lower electrode through the second contact hole; and a light emitting element disposed between the first and second upper electrodes. The first and second pixel electrodes may be respectively and electrically connected with the first and second upper electrodes.

18 Claims, 21 Drawing Sheets

(51) Int. Cl.

| | |
|---|---|
| *H10D 86/01* | (2025.01) |
| *H10D 86/40* | (2025.01) |
| *H10D 86/60* | (2025.01) |
| *H10H 20/01* | (2025.01) |
| *H10H 20/857* | (2025.01) |

(52) U.S. Cl.
CPC ........... *H10D 86/441* (2025.01); *H10D 86/60* (2025.01); *H10H 20/857* (2025.01); *H01L 24/95* (2013.01); *H01L 2224/24051* (2013.01); *H01L 2224/24147* (2013.01); *H01L 2224/244* (2013.01); *H01L 2224/95133* (2013.01); *H10H 20/0364* (2025.01)

(56) References Cited

U.S. PATENT DOCUMENTS

| | | | | |
|---|---|---|---|---|
| 2019/0172760 | A1* | 6/2019 | Hsiang | H01L 22/22 |
| 2020/0020672 | A1* | 1/2020 | Xi | H10H 20/857 |
| 2020/0043976 | A1* | 2/2020 | Kim | H01L 25/0753 |
| 2020/0235084 | A1* | 7/2020 | Wu | H10H 20/85 |
| 2020/0258938 | A1 | 8/2020 | Chai et al. | |
| 2021/0066562 | A1* | 3/2021 | Hsieh | H01L 24/81 |
| 2021/0242381 | A1* | 8/2021 | Lee | H01L 25/0753 |
| 2021/0265419 | A1 | 8/2021 | Kim et al. | |
| 2022/0130810 | A1 | 4/2022 | Park et al. | |

FOREIGN PATENT DOCUMENTS

| | | |
|---|---|---|
| KR | 10-2020-0088950 | 7/2020 |
| KR | 10-2021-0098313 | 8/2021 |
| KR | 10-2022-0053765 | 5/2022 |
| WO | 2019/128118 | 7/2019 |

* cited by examiner

BNP: BNP1~BNP3
ALE: ALE1~ALE4
LD: LD1~LD4
ELT: ELT1, ELT2
CNT: CNT1,CNT2
CH: CH1, CH2
OP: OP1~OP3
BRE: BRE1~BRE4
CTE: CTE1~CTE3

ALE: ALE1~ALE4
ELT: ELT1, ELT2
CNT: CNT1,CNT2
CH: CH1, CH2
OP: OP1~OP3
BRE: BRE1~BRE4
CTE: CTE1~CTE3

INSM1(INS1)
PCL
SUB

III        BRE1        ALE1        III'

DR3
DR2 ⊙ → DR1

INS1        INS1
PCL
SUB

III        BRE1        ALE1        III'

DR3
DR2 ⊙ → DR1

DISPLAY DEVICE AND METHOD OF FABRICATING THE SAME

CROSS-REFERENCE TO RELATED APPLICATION(S)

The application claims priority to and the benefit of Korean Patent Application No. 10-2021-0061608 under 35 U.S.C. § 119, filed on May 12, 2021, in the Korean Intellectual Property Office (KIPO), the entire contents of which are incorporated herein by reference.

BACKGROUND

1. Technical Field

Various embodiments of the disclosure relate to a display device and a method of fabricating the display device.

2. Description of Related Art

With an increase in interest in an information display and an increase in demand to use portable information media, demand for display devices is markedly increased, and commercialization thereof is in progress.

SUMMARY

Various embodiments of the disclosure are directed to a display device having enhanced reliability, and a method of fabricating the display device.

An embodiment of the disclosure may provide a display device including a plurality of pixels, each of the plurality of pixels including a first lower electrode and a second lower electrode disposed on a substrate and spaced apart from each other; a first upper electrode disposed on the first lower electrode; a second upper electrode disposed on the second lower electrode and spaced apart from the first upper electrode; a first insulating layer including a first contact hole exposing a portion of the first lower electrode, and a second contact hole exposing a portion of the second lower electrode; a first pixel electrode disposed on the first insulating layer, and directly contacting the first lower electrode through the first contact hole; a second pixel electrode disposed on the first insulating layer, and directly contacting the second lower electrode through the second contact hole; and a light emitting element disposed between the first upper electrode and the second upper electrode. The first pixel electrode may be electrically connected with the first upper electrode through the first lower electrode, and the second pixel electrode may be electrically connected with the second upper electrode through the second lower electrode.

In an embodiment, the first upper electrode may be disposed directly on the first lower electrode, and the second upper electrode may be disposed directly on the second lower electrode.

In an embodiment, the first lower electrode and the first upper electrode may have a same shape in a plan view except for an area corresponding to the first contact hole. The second lower electrode and the second upper electrode may have a same shape in a plan view except for an area corresponding to the second contact hole.

In an embodiment, the first lower electrode may be exposed by an opening of the first upper electrode in the area corresponding to the first contact hole. The second lower electrode may be exposed by an opening of the second upper electrode in the area corresponding to the second contact hole.

In an embodiment, the first lower electrode and the second lower electrode may include a same material. The first upper electrode and the second upper electrode may include a material different from the material of the first lower electrode and the second lower electrode.

In an embodiment, the first and the second lower electrodes may include a transparent conductive material. The first and the second pixel electrodes may include a material identical to the material of the first and the second lower electrodes.

In an embodiment, the first and the second upper electrodes may include an opaque conductive material.

In an embodiment, each of the plurality of pixels may further include a second insulating layer disposed on the first upper electrode and the second upper electrode. The light emitting element may be disposed on the second insulating layer between the first upper electrode and the second upper electrode.

In an embodiment, each of the plurality of pixels may further include an emission area in which the light emitting element is disposed; a non-emission area disposed adjacent to the emission area; and a bank disposed in the non-emission area, and including a first opening corresponding to the emission area, and a second opening and a third opening spaced apart from the first opening.

In an embodiment, the first contact hole and the second contact hole may be disposed in at least one of the second opening and the third opening.

In an embodiment, each of the plurality of pixels may further include a pixel circuit layer disposed between the substrate and the first and the second lower electrodes, the pixel circuit layer including at least one transistor and at least one power line; and a third insulating layer disposed on the at least one transistor and the at least one power line.

In an embodiment, the third insulating layer may include a first contact portion exposing a portion of the at least one transistor, and a second contact portion exposing a portion of the at least one power line. The first lower electrode may be electrically connected with the at least one transistor through the first contact portion. The second lower electrode may be electrically connected with the at least one power line through the second contact portion.

In an embodiment, the first contact portion and the second contact portion may overlap the bank.

In an embodiment, each of the plurality of pixels may include a color conversion layer disposed on the light emitting element, and converting a first color of light emitted from the light emitting element to a second color of light; and a color filter disposed on the color conversion layer and allowing the second color of light to selectively pass therethrough.

In an embodiment, each of the plurality of pixels may include an intermediate electrode disposed between the first pixel electrode and the second pixel electrode, and spaced apart from each of the first pixel electrode and the second pixel electrode. The intermediate electrode may include a first intermediate electrode, a second intermediate electrode, and a third intermediate electrode disposed at positions spaced apart from each other.

In an embodiment, the first pixel electrode and the second pixel electrode may be disposed on a same layer. At least one of the first intermediate electrode, the second intermediate electrode, and the third intermediate electrode and the first pixel electrode and the second pixel electrode may be disposed on a same layer.

In an embodiment, the light emitting element may include a first light emitting element disposed between the first pixel electrode and the first intermediate electrode, and electrically connected to the first pixel electrode and the first intermediate electrode; a second light emitting element disposed between the first intermediate electrode and the second intermediate electrode, and electrically connected to the first intermediate electrode and the second intermediate electrode; a third light emitting element disposed between the second intermediate electrode and the third intermediate electrode, and electrically connected to the second intermediate electrode and the third intermediate electrode; and a fourth light emitting element disposed between the third intermediate electrode and the second pixel electrode, and electrically connected to the third intermediate electrode and the second pixel electrode.

An embodiment of the disclosure may provide a method of fabricating a display device, including forming a lower electrode on a substrate; forming an upper electrode directly on the lower electrode; exposing a portion of the lower electrode by removing a portion of the upper electrode; forming a first insulating layer on the upper electrode; aligning a light emitting element on the first insulating layer; applying an insulating material layer to the first insulating layer and removing a portion of the insulating material layer and forming a second insulating layer including a contact hole formed to expose each of a portion of the upper electrode and a portion of the lower electrode; exposing the lower electrode by removing a portion of the upper electrode that corresponds to the contact hole; and forming a pixel electrode on the exposed lower electrode and the second insulating layer.

In an embodiment, the pixel electrode may directly contact the lower electrode exposed through the contact hole and be electrically connected with the upper electrode.

In an embodiment, the lower electrode may include a transparent conductive material, and the upper electrode may include an opaque conductive material.

The effects of an embodiment of the disclosure are not limited by the foregoing, and other various effects are anticipated herein.

BRIEF DESCRIPTION OF THE DRAWINGS

An additional appreciation according to the embodiments of the disclosure will become more apparent by describing in detail the embodiments thereof with reference to the accompanying drawings, wherein:

FIGS. 8 to 12 are schematic cross-sectional views taken along line I-I' of FIG. 6.

DETAILED DESCRIPTION OF THE EMBODIMENTS

Figure 1:
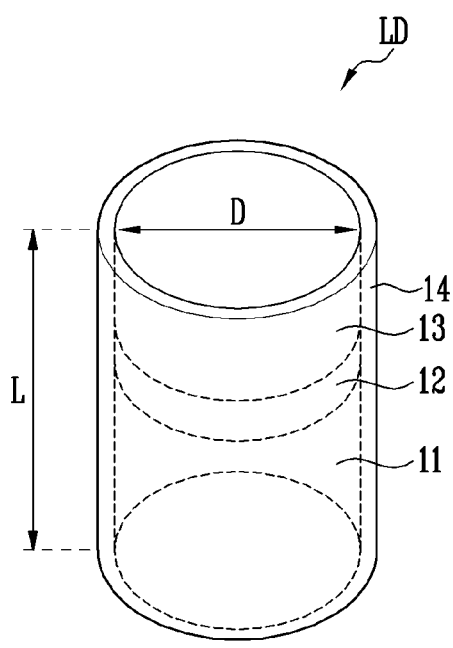
FIGS. 1 and 2 are perspective views schematically illustrating a light emitting element in accordance with an embodiment of the disclosure.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise," "include," "have," etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

It will be understood that when an element (e.g., a first element) is referred to as being (operatively or communicatively) "coupled with/to" or "connected with/to" another element (e.g., a second element), the first element may be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) intervenes between the element and the other element.

Embodiments and required details of the disclosure are described with reference to the accompanying drawings in order to describe the disclosure in detail so that those having ordinary knowledge in the technical field to which the disclosure pertains may easily practice the disclosure. Furthermore, a singular form may include a plural meaning as long as it is not specifically mentioned in a sentence.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
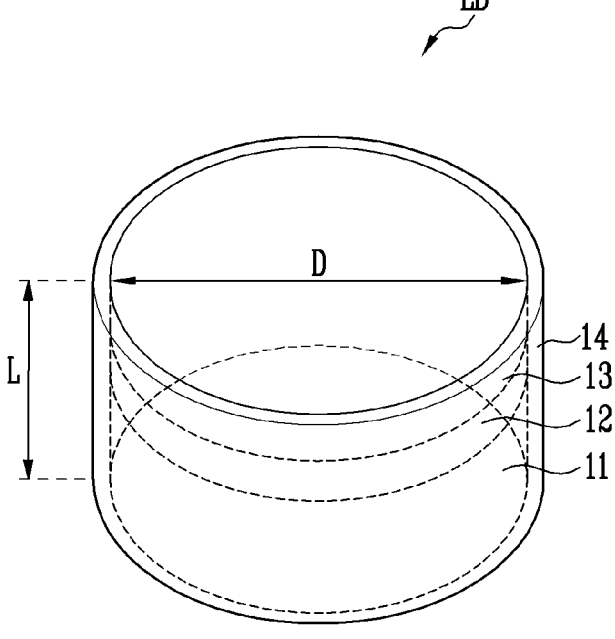
Figure 3:
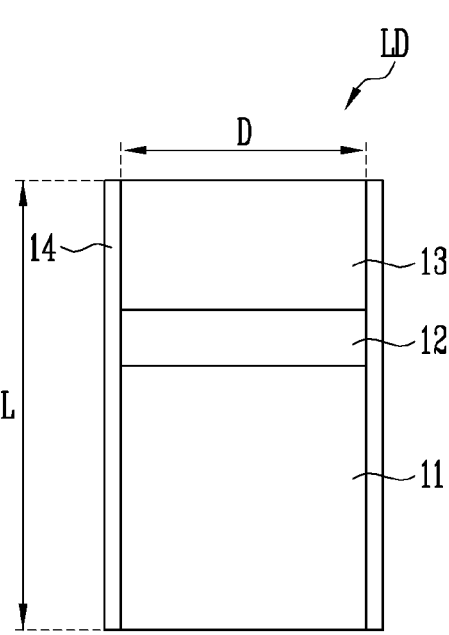
FIG. 3 is a cross-sectional view schematically illustrating the light emitting element of FIG. 1.

FIGS. 1 and 2 are perspective views schematically illustrating a light emitting element LD in accordance with an embodiment. FIG. 3 is a schematic cross-sectional view illustrating the light emitting element LD of FIG. 1.

In an embodiment, the type (or kind) and/or shape of the light emitting element LD is not limited to that in the embodiment illustrated in FIGS. 1 to 3.

Referring to FIGS. 1 to 3, the light emitting element LD may include a first semiconductor layer 11, a second semiconductor layer 13, and an active layer 12 disposed (or interposed) between the first and second semiconductor layers 11 and 13. For example, the light emitting element LD may be implemented as a light emitting stack formed by successively stacking the first conductive semiconductor layer (or first semiconductor layer) 11, the active layer 12, and the second conductive semiconductor layer (or second semiconductor layer) 13.

The light emitting element LD may be formed in a shape extending in a direction. If the direction in which the light emitting element LD extends is defined as a longitudinal direction, the light emitting element LD may have a first end (or a lower end) and a second end (or an upper end) in the longitudinal direction. One of the first and second semiconductor layers 11 and 13 may be disposed on the first end (or the lower end) of the light emitting element LD. The other of the first and second semiconductor layers 11 and 13 may be disposed on the second end (or the upper end) of the light emitting element LD. For example, the first semiconductor layer 11 may be disposed on the first end (or the lower end) of the light emitting element LD, and the second semiconductor layer 13 may be disposed on the second end (or the upper end) of the light emitting element LD.

The light emitting element LD may have various suitable shapes. For example, as illustrated in FIG. 1, the light emitting element LD may have a rod-like shape, a bar-like shape, or a pillar-like shape (e.g., a cylindrical shape) which is long (e.g., to have an aspect ratio greater than 1) in the longitudinal direction (or an extension direction). In an embodiment, the length L of the light emitting element LD in the longitudinal direction may be greater than the diameter D (or a width of a cross-section) thereof. However, the disclosure is not limited thereto. In an embodiment, as illustrated in FIG. 2, the light emitting element LD may have a rod-like shape, a bar-like shape, or a pillar-like shape which is short in the longitudinal direction (e.g., to have an aspect ratio less than 1). In an embodiment, the light emitting element LD may have a rod-like shape, a bar-like shape, or a pillar-like shape in which the length L thereof and the diameter D thereof are the same as each other.

The light emitting element LD may include a light-emitting diode (LED) fabricated to have a subminiature size, e.g., with a diameter D and/or a length L corresponding to the micrometer scale or the nanometer scale.

In case that the light emitting element LD is long (e.g., to have an aspect ratio greater than 1) in the longitudinal direction, the diameter D of the light emitting element LD may range from about 0.5 μm to about 6 and the length L thereof may range from about 1 μm to about 10 However, the diameter D and the length L of the light emitting element LD are not limited thereto. The size of the light emitting element LD may be changed to meet conditions (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer which includes a semiconductor material of InAlGaN, GaN, AlGaN, InGaN, AlN, and InN and is doped with a first conductive dopant (or an n-type dopant) such as Si, Ge, or Sn. However, the material of the first semiconductor layer 11 is not limited thereto, and the first semiconductor layer 11 may be formed of various materials. The first semiconductor layer 11 may include, in the longitudinal direction of the light emitting element LD, an upper surface that contacts the active layer 12, and a lower surface exposed to the outside. The lower surface of the first semiconductor layer 11 may correspond to the first end (or the lower end) of the light emitting element LD.

The active layer 12 may be disposed on the first semiconductor layer 11 and have a single or multiple quantum well structure. For example, in case that the active layer 12 has a multiple quantum well structure, the active layer 12 may be formed by periodically repeatedly stacking a barrier layer, a stain reinforcing layer, and a well layer which are provided as a unit. The stain reinforcing layer may have a lattice constant less than that of the barrier layer so that strain, e.g., compressive strain, to be applied to the well layer may be further reinforced. However, the structure of the active layer 12 is not limited to that of the foregoing embodiment.

The active layer 12 may emit light having a wavelength ranging from about 400 nm to about 900 nm, and use a double hetero structure. In an embodiment, a clad layer (not illustrated) doped with a conductive dopant may be formed over or under the active layer 12 in the longitudinal direction of the light emitting element LD. For example, the cladding layer may be formed of an AlGaN layer or an InAlGaN layer. In an embodiment, a material such as AlGaN or InAlGaN may be used to form the active layer 12, and various suitable other materials may be used to form the active layer 12. The active layer 12 may include a first surface which contacts the first semiconductor layer 11, and a second surface which contacts the second semiconductor layer 13.

If an electric field having a set or predetermined voltage or more is applied to opposite ends of the light emitting element LD, the light emitting element LD may emit light by coupling or combining of electron-hole pairs in the active layer 12. Since light emission of the light emitting element LD may be controlled based on the foregoing principle, the light emitting element LD may be used as a light source (a light emitting source) of various suitable light emitting devices as well as a pixel of the display device.

The second semiconductor layer 13 may be disposed on the second surface of the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which includes any semiconductor material of InAlGaN, GaN, AlGaN, InGaN, AlN, and InN, and is doped with a second conductive dopant (or a p-type dopant) such as Mg, Zn, Ca, Sr, or Ba. However, the material for forming the second semiconductor layer 13 is not limited thereto, and the second semiconductor layer 13 may be formed of various suitable other materials. The second semiconductor layer 13 may include, in the longitudinal direction of the light emitting element LD, a lower surface that contacts the second surface of the active layer 12, and an upper surface exposed to the outside. The upper surface of the second semiconductor layer 13 may correspond to the second end (or the upper end) of the light emitting element LD.

The first semiconductor layer 11 and the second semiconductor layer 13 may have different thicknesses in the longitudinal direction of the light emitting element LD. For example, the first semiconductor layer 11 may have a thickness greater than that of the second semiconductor layer 13 in the longitudinal direction of the light emitting element LD. Hence, the active layer 12 of the light emitting element LD may be disposed at a position closer to the upper surface of the second semiconductor layer 13 than to the lower surface of the first semiconductor layer 11. However, the disclosure is not limited thereto. In an embodiment, the first semiconductor layer 11 and the second semiconductor layer 13 may have a similar or identical thickness in the longitudinal direction of the light emitting element LD.

Although the first semiconductor layer 11 and the second semiconductor layer 13 each is formed of a single layer, the disclosure is not limited thereto. In an embodiment, depending on the material of the active layer 12, the first semiconductor layer 11 and the second semiconductor layer 13 each may further include at least one or more layers, for example, a clad layer and/or a tensile strain barrier reducing (TSBR) layer. The TSBR layer may be a strain relief layer which is disposed between semiconductor layers having different lattice structures to function as a buffer layer to reduce a difference in lattice constant therebetween. Although the TSBR layer may be formed of a p-type semiconductor layer such as p-GaInP, p-AlInP, or p-AlGaInP, the disclosure is not limited thereto.

In an embodiment, the light emitting element LD may further include a contact electrode (not illustrated, and hereinafter referred to as "first contact electrode") disposed on the second semiconductor layer 13, as well as the first semiconductor layer 11, the active layer 12, and the second semiconductor layer 13. Furthermore, in an embodiment, the light emitting element LD may further include another contact electrode (not illustrated, and hereinafter referred to as "second contact electrode") disposed on the first end of the first semiconductor layer 11.

Each of the first and second contact electrodes may be an ohmic contact electrode, but the disclosure is not limited thereto. In an embodiment, each of the first and second contact electrodes may be a Schottky contact electrode. The first and second contact electrodes may include a conductive material. For example, the first and second contact electrodes may include opaque metal such as chromium (Cr), titanium (Ti), aluminum (Al), gold (Au), nickel (Ni), and oxides or alloys thereof, which are used alone or in combination, but the disclosure is not limited thereto. In an embodiment, the first and second contact electrodes may also include transparent conductive oxides such as indium tin oxide (ITO), indium zinc oxide (IZO), zinc oxide (ZnO), indium gallium zinc oxide (IGZO), and indium tin zinc oxide (ITZO).

Materials included in the first and second contact electrodes may be equal to or different from each other. The first and second contact electrodes may be substantially transparent or translucent. Therefore, light generated from the light emitting element LD may pass through the first and second contact electrodes and then be emitted outside the light emitting element LD. In some embodiments, in case that light generated from the light emitting element LD is emitted outside the light emitting element LD through an area other than the opposite ends of the light emitting element LD rather than passing through the first and second contact electrodes, the first and second contact electrodes may include opaque metal.

In an embodiment, the light emitting element LD may further include an insulating layer 14 (or an insulating film). However, in some embodiments, the insulating layer 14 may be omitted, or may be provided to cover only some of the first semiconductor layer 11, the active layer 12, and the second semiconductor layer 13.

The insulating layer 14 may prevent the active layer 12 from short-circuiting due to contact with a conductive material except the first and second semiconductor layers 13. Furthermore, the insulating layer 14 may minimize a surface defect of the light emitting element LD, and thus the lifespan of the light emitting element LD and the emission efficiency thereof may be increased. In case that light emitting elements LD are disposed in close contact with each other, the insulating layer 14 may prevent undesired short-circuit between the light emitting elements LD. It is not limited whether the insulating layer 14 is provided or not, so long as the active layer 12 may be prevented from short-circuiting with an external conductive material.

The insulating layer 14 may be provided to enclose an overall outer circumferential surface of the light emitting stack including the first semiconductor layer 11, the active layer 12, and the second semiconductor layer 13.

Although in the foregoing embodiment the insulating layer 14 has been described as enclosing the entirety of the respective outer circumferential surfaces of the first semiconductor layer 11, the active layer 12, and the second semiconductor layer 13, the disclosure is not limited thereto. In an embodiment, in case that the light emitting element LD includes the first contact electrode, the insulating layer 14 may enclose the entirety of the respective outer circumferential surfaces of the first semiconductor layer 11, the active layer 12, the second semiconductor layer 13, and the first contact electrode. In an embodiment, the insulating layer 14 may not enclose the entirety of the outer circumferential surface of the first contact electrode, or may enclose only a portion of the outer circumferential surface of the first contact electrode but not enclose the other portion of the outer circumferential surface of the first contact electrode. Furthermore, in an embodiment, in case that the first contact electrode is disposed on the second end (or the upper end) of the light emitting element LD, and the second contact electrode is disposed on the first end (or the lower end) of the light emitting element LD, the insulating layer 14 may allow at least one area of each of the first and second contact electrodes to be exposed.

The insulating layer 14 may include a transparent insulating material. For example, the insulating layer 14 may be include one or more insulating materials selected from the group constituting of silicon oxide (SiO$_x$), silicon nitride (SiN$_x$), silicon oxynitride (SiO$_x$N$_y$), aluminum oxide (AlO$_x$), titanium oxide (TiO$_x$), hafnium oxide (HfO$_x$), titanstrontium oxide (SrTiO$_x$), cobalt oxide (CoxO$_y$), magnesium oxide (MgO), zinc oxide (ZnO), ruthenium Oxide (RuO$_x$), nickel oxide (NiO), tungsten oxide (WO$_x$), tantalum oxide (TaO$_x$), gadolinium oxide (GdO$_x$), zirconium oxide (ZrO$_x$), gallium oxide (GaO$_x$), vanadium oxide (V$_x$O$_y$), ZnO:Al, ZnO:B, InxOy:H, niobium oxide (Nb$_x$O$_y$), magnesium fluoride (MgF$_x$), aluminum fluoride (AlF$_x$), an alucone polymer film, titanium nitride (TiN), tantalum nitride (TaN), aluminum nitride (AlN$_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the disclosure is not limited thereto, and various suitable materials having insulation may be used as the material of the insulating layer 14.

The insulating layer 14 may be provided in the form of a single layer or in the form of multiple layers including at least double layers. For example, in case that the insulating layer 14 is formed of a double layer structure including a first layer and a second layer that are successively stacked, the first layer and the second layer may be made of different materials (or substances) and be formed by different processes. In an embodiment, the first layer and the second layer may include the same material and be formed by a successive process.

In an embodiment, the light emitting element LD may be implemented as a light emitting pattern having a core-shell structure. In this case, the first semiconductor layer 11 may be disposed in a core of the light emitting element LD, e.g., a central portion of the light emitting element LD. The active layer 12 may be provided and/or formed to enclose the outer circumferential surface of the first semiconductor layer 11. The second semiconductor layer 13 may be provided and/or formed to enclose the active layer 12. Furthermore, the light emitting element LD may further include a contact electrode (not illustrated) formed to enclose at least one side of the second semiconductor layer 13. In an embodiment, the light emitting element LD may further include an insulating layer 14 which is provided on the outer circumferential surface of the light emitting pattern having a core-shell structure and has transparent insulating material. The light emitting element LD implemented as the light emitting pattern having the core-shell structure may be manufactured in a growth manner.

The light emitting element LD may be employed as a light emitting source (or a light source) for various suitable display devices. The light emitting element LD may be fabricated through a surface treatment process. For example, the light emitting element LD may be surface-treated so that, in case that light emitting elements LD are mixed with a fluidic solution (or solvent) and then supplied to each pixel area (e.g., an emission area of each pixel or an emission area of each sub-pixel), the light emitting elements (or light emitting diodes) LD may be evenly distributed rather than unevenly aggregating in the solution.

A light emitting unit (or a light emitting device) including the light emitting element LD described above may be used in various suitable types (or kinds) of devices including a display device which requires a light source. For instance, in case that light emitting elements LD are disposed in the pixel area of each pixel of a display panel, the light emitting elements LD may be used as a light source of the pixel. However, the application field of the light emitting element LD is not limited to the above-mentioned examples. For example, the light emitting element LD may also be used in other types (or kinds) of electronic devices such as a lighting device, which requires a light source.

Figure 4:
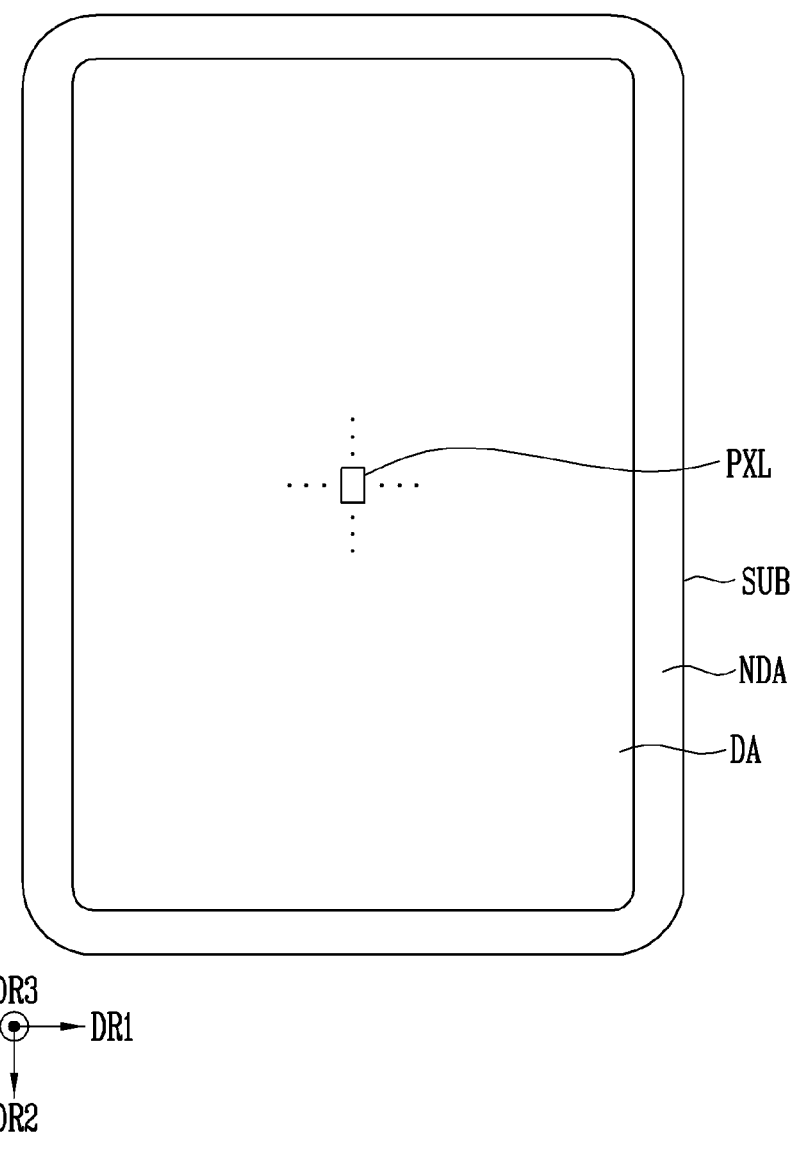
FIG. 4 is a plan view schematically illustrating a display device in accordance with an embodiment of the disclosure.

FIG. 4 is a plan view schematically illustrating a display device in accordance with an embodiment.

For the sake of explanation, FIG. 4 schematically illustrates the structure of the display device, focusing on a display area DA on which an image is displayed.

If the display device is an electronic device having a display surface on at least one surface thereof, e.g., a smartphone, a television, a tablet PC, a mobile phone, a video phone, an electronic reader, a desktop PC, a laptop PC, a netbook computer, a workstation, a server, a personal digital assistant (PDA), a portable multimedia player (PMP), an MP3 player, a medical appliance, a camera, or a wearable device, the disclosure may be applied to a display device.

Referring to FIGS. 1 to 4, the display device may include a substrate SUB, pixels PXL provided on the substrate SUB and each including at least one light emitting element LD, a driver provided on the substrate SUB and configured to drive the pixels PXL, and a line component provided to connect the pixels PXL with the driver.

The display device may be classified into a passive matrix type display device and an active matrix type display device according to a method of driving the light emitting element LD. For example, in case that the display device is implemented as an active matrix type, each of the pixels PXL may include a driving transistor configured to control the amount of current to be supplied to the light emitting element LD, and a switching transistor configured to transmit a data signal to the driving transistor.

The display device may be provided in various suitable forms, for example, in the form of a rectangular plate having two pairs of parallel sides, but the disclosure is not limited thereto. In case that the display device is provided in the form of a rectangular plate, a pair of sides of the two pairs of sides may be longer than the other. For the sake of explanation, there is illustrated the case where the display device has a rectangular shape with a pair of long sides and a pair of short sides. A direction in which the long sides extend is indicated by a second direction DR2, a direction in which the short sides extend is indicated by a first direction DR1, and a thickness direction of the substrate SUB is indicated by a third direction DR3. In the display device provided in a rectangular planar shape, each corner on which a long side and a short side contact (or meet) each other may have a round shape.

The substrate SUB may include a display area DA and a non-display area NDA.

The display area DA may be an area in which the pixels PXL for displaying an image are provided. The non-display area NDA may be an area in which the driver for driving the pixels PXL and some of the line component for coupling or connecting the pixels PXL to the driver are provided. For the sake of explanation, FIG. 4 illustrates only a pixel PXL, but pixels PXL may be substantially provided in the display area DA of the substrate SUB.

The non-display area NDA may be provided in at least one side of the display area DA. The non-display area NDA may enclose the perimeter (or edges) of the display area DA. The line component electrically connected to the pixels PXL, and the driver electrically connected to the line component and configured to drive the pixels PXL may be provided in the non-display area NDA.

The line component may electrically connect the driver with the pixels PXL. The line component may be a fan-out line electrically connected with signal lines, e.g., a scan line, a data line, and an emission control line, which are electrically connected to each pixel PXL to provide signals to the pixel PXL. Furthermore, the line component may be a fan-out line electrically connected to signal lines, e.g., a control line and a sensing line, which are electrically connected to each pixel PXL to compensate in real time for variation in electrical characteristics of the pixel PXL.

The substrate SUB may include a transparent insulating material to allow light transmission. The substrate SUB may be a rigid substrate or a flexible substrate.

An area on the substrate SUB is provided as the display area DA in which the pixels PXL are disposed, and the other area thereof is provided as the non-display area NDA. For example, the substrate SUB may include the display area DA including pixel areas on which the respective pixels PXL are disposed, and the non-display area NDA disposed around the perimeter of the display area DA (or adjacent to the display area DA).

The pixels PXL may be provided in the display area DA on the substrate SUB. In an embodiment, the pixels PXL may be arranged in the display area DA in a stripe arrangement structure or a PenTile® arrangement structure, but the disclosure is not limited thereto.

Each of the pixels PXL may include at least one light emitting element LD configured to be driven in response to a corresponding scan signal and a corresponding data signal. The light emitting element LD may have a small size corresponding to the nanometer scale or the micrometer scale and be electrically connected in parallel to light emitting elements LD disposed adjacent thereto, but the disclosure is not limited thereto. The light emitting element LD may form a light source of each pixel PXL.

Each of the pixels PXL may include at least one light source, e.g., the light emitting element LD illustrated in FIGS. 1 and/or 2, which is driven by a predetermined signal (e.g., a scan signal and a data signal) and/or a predetermined power supply (e.g., a first driving power supply and a second driving power supply). However, in embodiments, the type (or kind) of the light emitting element LD which may be used as a light source of each of the pixels PXL is not limited thereto.

The driver may provide a predetermined signal and a predetermined power voltage to each of the pixels PXL through the line component and thus control the operation of the pixel PXL. The driver may include a scan driver, an emission driver, a data driver, and a timing controller.

Figure 5:
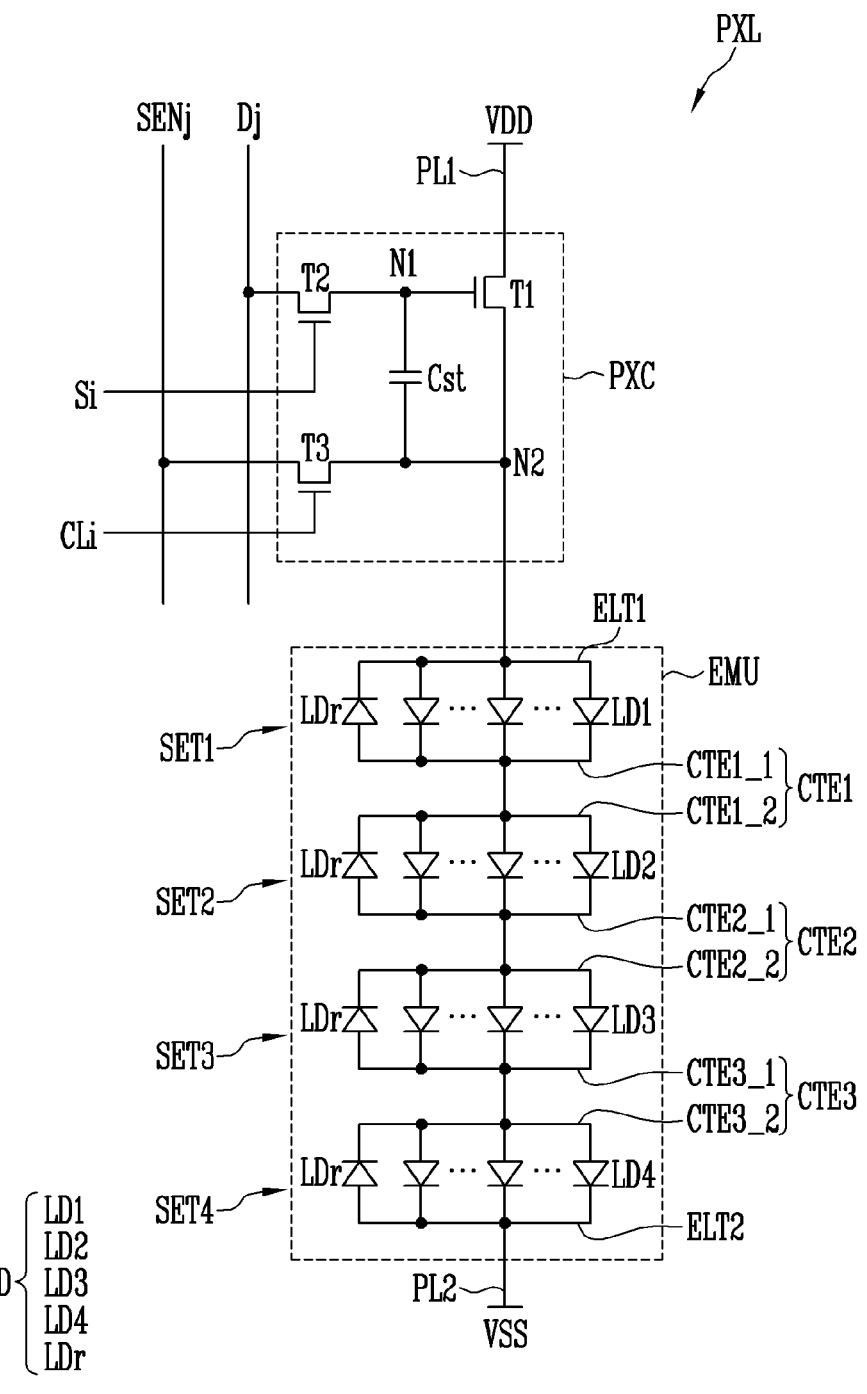
FIG. 5 is a circuit diagram schematically illustrating an embodiment of electrical connection relationship of components included in each pixel illustrated in FIG. 4.

FIG. 5 is a circuit diagram schematically illustrating an embodiment of electrical connection relationship of components included in each pixel PXL illustrated in FIG. 4.

For example, FIG. 5 illustrates the electrical connection relationship of components included in the pixel PXL that may be employed in an active matrix type display device in accordance with an embodiment. However, the types (or kinds) of the components included in the pixel PXL to which embodiments may be applied are not limited thereto.

In FIG. 5, not only the components included in the pixel PXL illustrated in FIG. 4 but also an area in which the components are provided may be referred to as "pixel PXL".

Referring to FIGS. 1 to 5, the pixel PXL may include an emission unit EMU (or an emitter) configured to generate light having a luminance corresponding to a data signal. Furthermore, the pixel PXL may selectively further include a pixel circuit PXC configured to drive the emission unit EMU.

In an embodiment, the emission unit EMU may include light emitting elements LD electrically connected in parallel between a first power line PL1 to which a voltage of a first driving power supply VDD is applied, and a second power line PL2 to which a voltage of a second driving power supply VSS is applied. For example, the emission unit EMU may include a first pixel electrode ELT1 electrically connected to the first driving power supply VDD via the pixel circuit PXC and the first power line PL1, a second pixel electrode ELT2 electrically connected to the second driving power supply VSS through the second power line PL2, and light emitting elements LD electrically connected in parallel to each other in the same direction between the first and second pixel electrodes ELT1 and ELT2. In an embodiment, the first pixel electrode ELT1 may be an anode, and the second pixel electrode ELT2 may be a cathode.

Each of the light emitting elements LD included in the emission unit EMU may include a first end electrically connected to the first driving power supply VDD through the first pixel electrode ELT1, and a second end electrically connected to the second driving power supply VSS through the second pixel electrode ELT2. The first driving power supply VDD and the second driving power supply VSS may have different potentials. For example, the first driving power supply VDD may be set as a high-potential power supply, and the second driving power supply VSS may be set as a low-potential power supply. A difference in potential between the first and second driving power supplies VDD and VSS may be set to a value equal to or greater than a threshold voltage of the light emitting elements LD during an emission period of the pixel PXL.

As described above, the light emitting elements LD that are electrically connected in parallel to each other in the same direction (e.g., in a forward direction) between the first pixel electrode ELT1 and the second pixel electrode ELT2 to which voltages having different potentials are respectively supplied may form respective valid light sources.

The light emitting elements LD of the emission unit EMU may emit light having a luminance corresponding to driving current supplied thereto through the pixel circuit PXC. For example, during each frame period, the pixel circuit PXC may supply driving current corresponding to a gray scale value of corresponding frame data to the emission unit EMU. The driving current supplied to the emission unit EMU may be divided and flow into the respective light emitting elements LD. Hence, each of the light emitting elements LD may emit light having a luminance corresponding to current applied thereto, so that the emission unit EMU may emit light having a luminance corresponding to the driving current.

Although there has been illustrated the embodiment in which the opposite ends of the light emitting elements LD are electrically connected in the same direction between the first and second driving power supplies VDD and VSS, the disclosure is not limited thereto. In an embodiment, the emission unit EMU may further include at least one invalid light source, e.g., a reverse light emitting element LDr, as well as including the light emitting elements LD that form the respective valid light sources. The reverse light emitting element LDr, along with the light emitting elements LD that form the valid light sources, may be electrically connected in parallel to each other between the first and second electrodes (or first and second pixel electrodes) ELT1 and ELT2. The reverse light emitting element LDr may be electrically connected between the first and second pixel electrodes ELT1 and ELT2 in a direction opposite to that of the light emitting elements LD. Even if a predetermined driving voltage (e.g., a normal directional driving voltage) is applied between the first and second pixel electrodes ELT1 and ELT2, the reverse light emitting element LDr remains disabled. Hence, current substantially does not flow through the reverse light emitting element LDr.

The pixel circuit PXC may be electrically connected to a scan line Si and a data line Dj of the pixel PXL. For example, in case that the pixel PXL is disposed on an i-th row and a j-th column of the display area DA, the pixel circuit PXC of the pixel PXL may be electrically connected to an i-th scan line Si, a j-th data line Dj, an i-th control line CLi, and a j-th sensing line SENj of the display area DA.

The pixel circuit PXC may include first to third transistors T1 to T3 and a storage capacitor Cst.

The first transistor T1 may be a driving transistor configured to control driving current to be applied to the emission unit EMU and be electrically connected between the first driving power supply VDD and the emission unit EMU. In detail, a first terminal of the first transistor T1 may be electrically connected (or coupled) to the first driving power supply VDD through a first power line PL1. A second terminal of the first transistor T1 may be connected to a second node N2. A gate electrode of the first transistor T1 may be connected to a first node N1. The first transistor T1 may control, in response to a voltage applied to the first node N1, the amount of driving current to be applied from the first driving power supply VDD to the emission unit EMU through the second node N2. In an embodiment, the first terminal of the first transistor T1 may be a drain electrode, and the second terminal of the first transistor T1 may be a source electrode, and the disclosure is not limited thereto. In an embodiment, the first terminal may be a source electrode, and the second terminal may be a drain electrode.

The second transistor T2 may be a switching transistor which selects a pixel PXL in response to a scan signal and activates the pixel PXL, and may be electrically connected between the data line Dj and the first node N1. A first terminal of the second transistor T2 may be electrically connected to the data line Dj. A second terminal of the second transistor T2 may be electrically connected to the first node N1. A gate electrode of the second transistor T2 may be electrically connected to the scan line Si. The first terminal and the second terminal of the second transistor T2 are different from each other, and, for example, if the first terminal is a drain electrode, and the second terminal is a source electrode.

In case that a scan signal having a gate-on voltage (e.g., a high-level voltage) is supplied from the scan line Si, the second transistor T2 may be turned on to electrically connect the data line Dj with the first node N1. The first node N1 may be a point at which the second terminal of the second transistor T2 and the gate electrode of the first transistor T1 are electrically connected to each other. The second transistor T2 may transmit a data signal to the gate electrode of the first transistor T1.

The third transistor T3 may obtain a sensing signal through the sensing line SENj by electrically connecting the first transistor T1 to the sensing line SENj, and detect, using the sensing signal, characteristics of the pixel PXL such as a threshold voltage of the first transistor T1. Information about the characteristics of the pixel PXL may be used to convert image data such that a deviation in characteristic between pixels PXL may be compensated for. A second terminal of the third transistor T3 may be electrically connected to the second terminal of the first transistor T1. A first terminal of the third transistor T3 may be electrically connected to the sensing line SENj. A gate electrode of the third transistor T3 may be electrically connected to the control line CLi. Furthermore, the first terminal of the third transistor T3 may be electrically connected to an initialization power supply. The third transistor T3 may be an initialization transistor configured to initialize the second node N2, and may be turned on in case that a sensing control signal is supplied thereto from the control line CLi, so that a voltage of the initialization power supply may be transmitted to the second node N2. Hence, a second storage electrode (or an upper electrode) of the storage capacitor Cst electrically connected to the second node N2 may be initialized.

A first storage electrode of the storage capacitor Cst may be electrically connected to the first node N1. A second storage electrode of the storage capacitor Cst may be electrically connected to the second node N2. The storage capacitor Cst may be charged with a data voltage corresponding to a data signal to be supplied to the first node N1 during a frame period. Hence, the storage capacitor Cst may store a voltage corresponding to a difference between a voltage of the gate electrode of the first transistor T1 and a voltage of the second node N2.

Each emission unit EMU may include at least one serial set (or stage) including light emitting elements LD electrically connected in parallel to each other. In other words, as illustrated in FIG. 5, the emission unit EMU may have a serial-parallel combination structure.

For example, the emission unit EMU may include first to fourth serial sets (or stages) SET1, SET2, SET3, and SET4 which are successively electrically connected between the first and second driving power supplies VDD and VSS. Each of the first to fourth serial sets SET1, SET2, SET3, and SET4 may include two electrodes ELT1 and CTE1_1, CTE1_2 and CTE2_1, CTE2_2 and CTE3_1, and CTE3_2 and ELT2 that form an electrode pair of the corresponding serial set, and light emitting elements LD electrically connected in parallel to each other in the same direction between the two electrodes ELT1 and CTE1_1, CTE1_2 and CTE2_1, CTE2_2 and CTE3_1, and CTE3_2 and ELT2.

The first serial set (or the first stage) SET1 may include a first pixel electrode ELT1, a 1-1-th intermediate electrode CTE1_1, and at least one first light emitting element LD1 electrically connected between the first pixel electrode ELT1 and the 1-1-th intermediate electrode CTE1_1. Furthermore, the first serial set SET1 may include a reverse light emitting element LDr electrically connected between the first pixel electrode ELT1 and the 1-1-th intermediate electrode CTE1_1 in a direction opposite to that of the first light emitting element LD1.

The second serial set (or the second stage) SET2 may include a 1-2-th intermediate electrode CTE1_2, a 2-1-th intermediate electrode CTE2_1, and at least one second light emitting element LD2 electrically connected between the 1-2-th intermediate electrode CTE1_2 and the 2-1-th intermediate electrode CTE2_1. Furthermore, the second serial set SET2 may include a reverse light emitting element LDr electrically connected between the 1-2-th intermediate electrode CTE1_2 and the 2-1-th intermediate electrode CTE2_1 in a direction opposite to that of the second light emitting element LD2.

The 1-1-th intermediate electrode CTE1_1 of the first serial set SET1 and the 1-2-th intermediate electrode CTE1_2 of the second serial set SET2 may be integrally provided and electrically connected to each other. In other words, the 1-1-th intermediate electrode CTE1_1 and the 1-2-th intermediate electrode CTE1_2 may form a first intermediate electrode CTE1 that electrically connect the first serial set SET1 and the second serial set SET2 that are successively provided. In case that the 1-1-th intermediate electrode CTE1_1 and the 1-2-th intermediate electrode CTE1_2 are integrally provided, the 1-1-th intermediate electrode CTE1_1 and the 1-2-th intermediate electrode CTE1_2 may be respectively different areas of the first intermediate electrode CTE1.

The third serial set (or the third stage) SET3 may include a 2-2-th intermediate electrode CTE2_2, a 3-1-th intermediate electrode CTE3_1, and at least one third light emitting element LD3 electrically connected between the 2-2-th intermediate electrode CTE2_2 and the 3-1-th intermediate electrode CTE3_1. Furthermore, the third serial set SET3 may include a reverse light emitting element LDr electrically connected between the 2-2-th intermediate electrode CTE2_2 and the 3-1-th intermediate electrode CTE3_1 in a direction opposite to that of the third light emitting element LD3.

The 2-1-th intermediate electrode CTE2_1 of the second serial set SET2 and the 2-2-th intermediate electrode CTE2_2 of the third serial set SET3 may be integrally provided and electrically connected to each other. In other words, the 2-1-th intermediate electrode CTE2_1 and the 2-2-th intermediate electrode CTE2_2 may form a second intermediate electrode CTE2 that electrically connect the second serial set SET2 and the third serial set SET3 that are successively provided. In case that the 2-1-th intermediate electrode CTE2_1 and the 2-2-th intermediate electrode CTE2_2 are integrally provided, the 2-1-th intermediate electrode CTE2_1 and the 2-2-th intermediate electrode CTE2_2 may be respectively different areas of the second intermediate electrode CTE2.

The fourth serial set (or the fourth stage) SET4 may include a 3-2-th intermediate electrode CTE3_2, a second pixel electrode ELT2, and at least one fourth light emitting element LD4 electrically connected between the 3-2-th intermediate electrode CTE3_2 and the second pixel electrode ELT2. Furthermore, the fourth serial set SET4 may include a reverse light emitting element LDr electrically connected between the 3-2-th intermediate electrode CTE3_2 and the second pixel electrode ELT2 in a direction opposite to that of the fourth light emitting element LD4.

The 3-1-th intermediate electrode CTE3_1 of the third serial set SET3 and the 3-2-th intermediate electrode CTE3_2 of the fourth serial set SET4 may be integrally provided and electrically connected to each other. In other words, the 3-1-th intermediate electrode CTE3_1 and the 3-2-th intermediate electrode CTE3_2 may form a third intermediate electrode CTE3 that electrically connect the third serial set SET3 and the fourth serial set SET4 that are successively provided. In case that the 3-1-th intermediate electrode CTE3_1 and the 3-2-th intermediate electrode CTE3_2 are integrally provided, the 3-1-th intermediate electrode CTE3_1 and the 3-2-th intermediate electrode CTE3_2 may be respectively different areas of the third intermediate electrode CTE3.

In the foregoing embodiment, the first pixel electrode ELT1 of the first serial set SET1 may be an anode electrode of the emission unit EMU. The second pixel electrode ELT2 of the fourth serial set SET4 may be a cathode electrode of the emission unit EMU.

As described above, the emission unit EMU of the pixel PXL including the first to fourth serial sets SET1, SET2, SET3, and SET4 (or the light emitting elements LD) electrically connected to each other in the serial-parallel combination structure may easily adjust driving current/voltage conditions in response to specifications of a product to which the emission unit EMU is to be applied.

For example, the emission unit EMU of the pixel PXL including the first to fourth serial sets SET1, SET2, SET3, and SET4 (or the light emitting elements LD) electrically connected to each other in the serial-parallel combination structure may reduce driving current, compared to that of the emission unit EMU having a structure in which the light emitting elements LD are connected only in parallel to each other. Furthermore, the emission unit EMU of the pixel PXL including the first to fourth serial sets SET1, SET2, SET3, and SET4 electrically connected to each other in the serial-parallel combination structure may reduce driving current to be applied to the opposite ends of the emission unit EMU, compared to that of the emission unit EMU having a structure such that all of the light emitting elements LD, the number of which is the same as that of the emission unit EMU, are electrically connected in series to each other. In addition, the emission unit EMU of the pixel PXL including the first to fourth serial sets SET1, SET2, SET3, and SET4 (or the light emitting elements LD) electrically connected to each other in the serial-parallel combination structure may increase the number of light emitting elements LD included between the electrodes ELT1, CTE1_1, CTE1_2, CTE2_1, CTE2_2, CTE3_1, CET3_2, and ELT2, compared to that of the emission unit EMU having a structure in which all of the serial sets (or stages) are electrically connected in series to each other. In this case, the light output efficiency of the light emitting elements LD may be enhanced. Even if a defect occurs in a specific serial set (or stage), the ratio of light emitting elements LD that cannot emit light due to the defect may be reduced, so that a reduction in the light output efficiency of the light emitting elements LD may be mitigated.

Although FIG. 5 illustrates an embodiment where all of the first to third transistors T1, T2, and T3 are N-type transistors, the disclosure is not limited thereto. For example, at least one of the first to third transistors T1, T2, and T3 may be changed to a P-type transistor. Furthermore, although FIG. 5 illustrates an embodiment where the emission unit EMU is electrically connected between the pixel circuit PXC and the second driving power supply VSS, the emission unit EMU may be electrically connected between the first driving power supply VDD and the pixel circuit PXC.

The structure of the pixel circuit PXC may be changed in various ways. For example, the pixel circuit PXC may further include at least one transistor element such as a transistor element configured to initialize the first node N1, and/or a transistor element configured to control an emission time of the light emitting elements LD, or other circuit elements such as a boosting capacitor for boosting the voltage of the first node N1.

The structure of the pixel PXL which may be applied to the disclosure is not limited to the embodiment illustrated in FIG. 5, and the pixel PXL may have various suitable structures. For example, the pixel PXL may be configured in a passive light emitting display device, or the like. In this case, the pixel circuit PXC may be omitted, and the opposite ends of the light emitting elements LD included in the emission unit EMU may be directly electrically connected to the scan lines Si, the data line Dj, the first power line PL1 to which the first driving power supply VDD is to be applied, the second power line PL2 to which the second driving power supply VSS is to be applied, and/or a control line.

Figure 6:
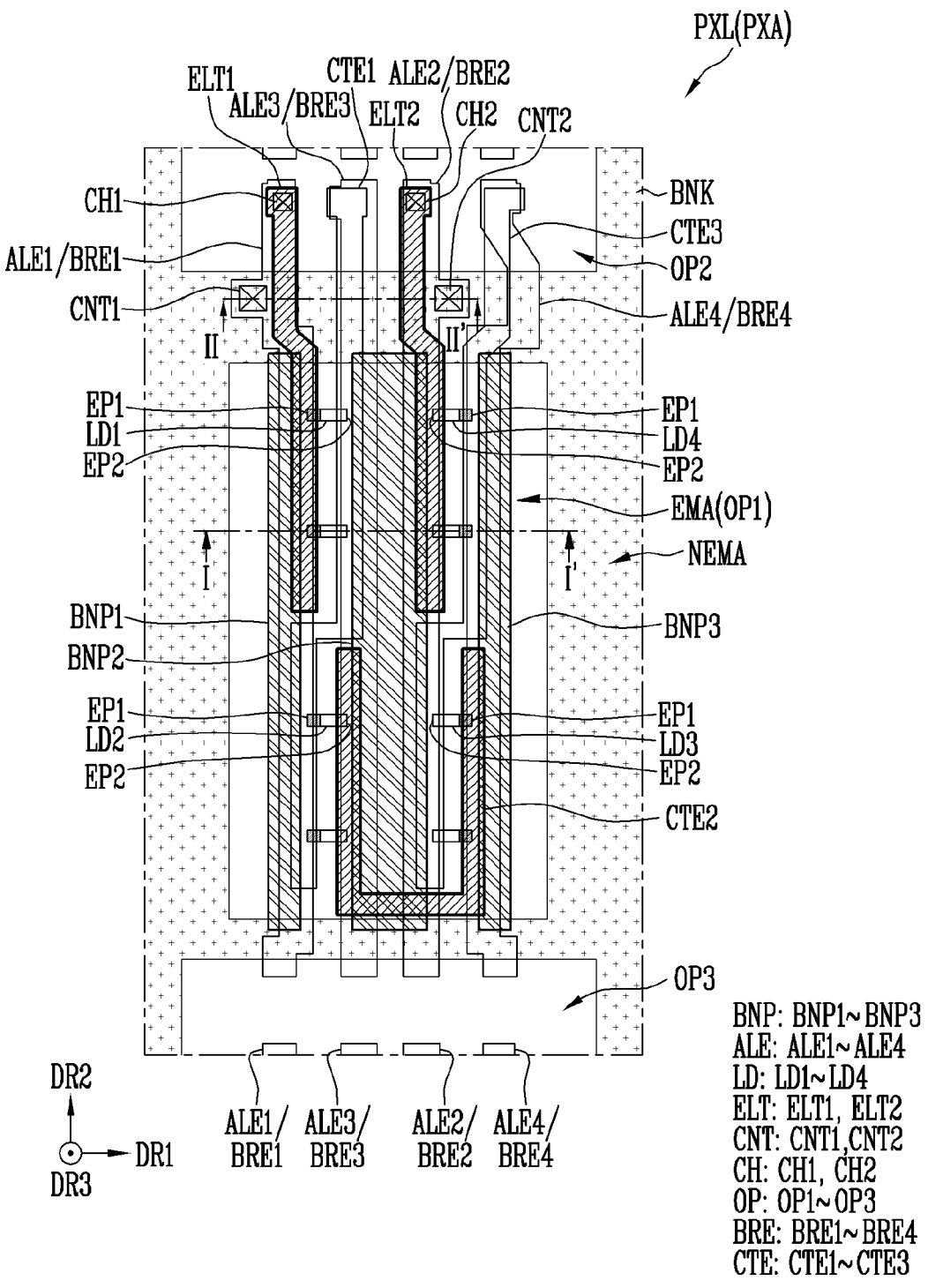
FIG. 6 is a schematic plan view illustrating each pixel illustrated in FIG. 4.
Figure 7:
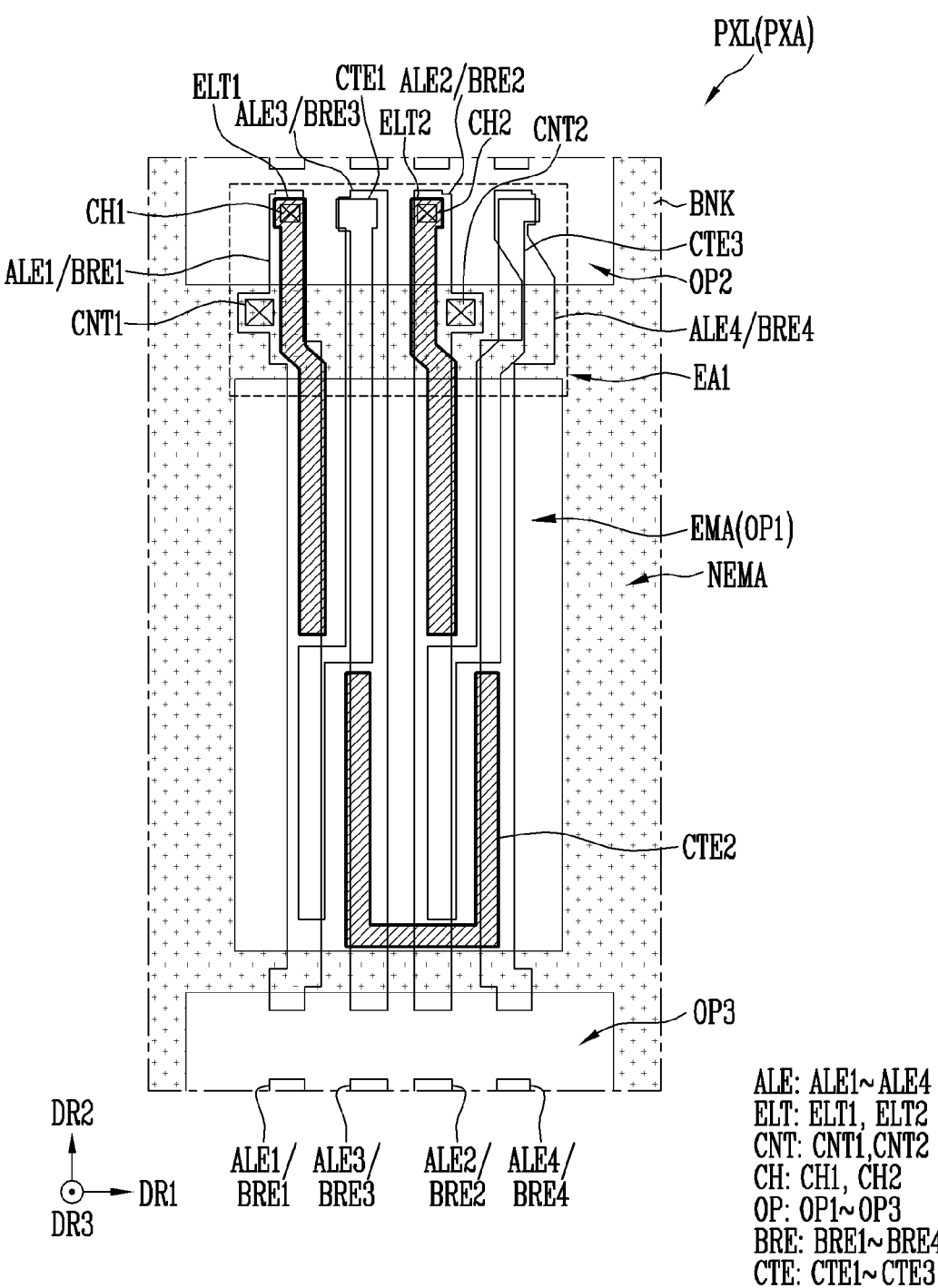
FIG. 7 is a plan view schematically illustrating only a connection electrode, an alignment electrode, a pixel electrode, and an intermediate electrode in the pixel of FIG. 6.

FIG. 6 is a plan view schematically illustrating a pixel PXL illustrated in FIG. 4. FIG. 7 is a plan view schematically illustrating only a connection electrode BRE, an alignment electrode ALE, a pixel electrode ELT, and an intermediate electrode CTE in the pixel PXL of FIG. 6.

In FIG. 6, for the sake of explanation, illustration of the transistors T electrically connected to the light emitting elements LD and the signal lines electrically connected to the transistors T is omitted.

In an embodiment, for the sake of explanation, a transverse direction (or a horizontal direction) in a plan view is indicated by a first direction DR1, a longitudinal direction (or a vertical direction) in a plan view is indicated by a second direction DR2, and a thickness direction of the substrate SUB in a sectional view is indicated by a third direction DR3. The first to third directions DR1, DR2, and DR3 may refer to the directions indicated by the first to third directions DR1, DR2, and DR3, respectively.

In addition, in an embodiment, the term "connection" between two components may refer to electrical connection and physical connection, but the disclosure is not limited thereto.

Referring to FIGS. 4 to 7, the pixel PXL may be provided and/or formed in a pixel area PXA defined on the substrate SUB. The pixel area PXA may include an emission area EMA and a non-emission area NEMA.

In an embodiment, the pixel PXL may include a bank BNK disposed in the non-emission area NEMA.

The bank BNK may be a structure for defining (or partitioning) the respective pixel areas PXA or the respective emission areas EMA of the pixel PXL and pixels PXL adjacent thereto and, for example, may be a pixel defining layer.

In an embodiment, the bank BNK may be a pixel defining layer or a dam structure for defining each emission area EMA to which the light emitting elements LD are to be supplied, during a process of supplying (or inputting) the light emitting elements LD to the pixel PXL. For example, since the emission area EMA of the pixel PXL is defined by the bank BNK, a mixed solution (e.g., ink) including a target amount and/or type (or kind) of light emitting elements LD may be supplied (or input) to the emission area EMA.

The bank BNK may include at least one light shielding material and/or reflective material, thereby preventing a light leakage defect in which light (or rays) leaks between the pixel PXL and the pixels PXL adjacent thereto. In an embodiment, the bank BNK may include a transparent material (or substance). The transparent material may include, for example, polyamides resin, polyimides resin, etc., but the disclosure is not limited thereto. In an embodiment, in order to enhance the efficiency of light emitted from the pixel PXL, a separate reflective material layer may be provided and/or formed on the bank BNK.

The bank BNK may include at least one opening OP which exposes components disposed under the bank BNK in the pixel area PXA of the pixel PXL. For example, the bank BNK may include first to third openings OP1, OP2, and OP3 which expose components disposed under the bank BNK in the pixel area PXA of the pixel PXL. In an embodiment, the emission area EMA of the pixel PXL and the first opening OP1 of the bank BNK may correspond to each other.

In the pixel area PXA, the second opening OP2 of the bank BNK may be disposed at a position spaced apart from the first opening OP1 and disposed adjacent to a side, e.g., an upper side, of the pixel area PXA. Furthermore, in the pixel area PXA, the third opening OP3 of the bank BNK may be disposed at a position spaced apart from the first opening OP1 and disposed adjacent to the other side, e.g., a lower side, of the pixel area PXA.

In an embodiment, the second opening OP2 and the third opening OP3 each may be an electrode separation area where at least one alignment electrode ALE is separated from at least one alignment electrode ALE provided in pixels PXL adjacent thereto in the second direction DR2.

The pixel PXL may include pixel electrodes ELT and intermediate electrodes CTE which are provided at least in the emission area EMA, light emitting elements LD electrically connected between the pixel electrodes ELT and the intermediate electrodes CTE, alignment electrodes ALE (or upper electrodes) provided at positions corresponding to the pixel electrodes ELT and the intermediate electrodes CTE, connection electrodes BRE (or lower electrodes) provided under each of the alignment electrodes ALE, and bank patterns BNP (or patterns) provided under the connection electrodes BRE such that each bank pattern BNP overlap at least one connection electrode BRE. For example, the pixel PXL may include first and second pixel electrodes ELT1 and ELT2, first to third intermediate electrodes CTE1, CTE2, and CTE3, light emitting elements LD, first to fourth alignment electrodes ALE1, ALE2, ALE3, and ALE4 (or first to fourth upper electrodes), first to fourth connection electrodes BRE1, BRE2, BRE3, and BRE4 (or first to fourth lower electrodes), and first to third bank patterns BNP1, BNP2, and BNP3 which are provided at least in the emission area EMA. The pixel PXL may include at least one pair of pixel electrodes ELT, alignment electrodes ALE, connection electrodes BRE, and/or bank patterns BNP. The pixel electrodes ELT, the alignment electrodes ALE, the connection electrodes BRE, and/or the bank patterns BNP each may change in number, shape, size, arrangement structure, etc. in various suitable ways depending on the structure of the pixel PXL (for example, the emission unit EMU).

In an embodiment, based on a surface of the substrate SUB on which the pixel PXL is provided, the bank patterns BNP, the connection electrodes BRE, the alignment electrodes ALE, the light emitting elements LD, the pixel electrodes ELT, and/or the intermediate electrodes CTE may be provided in the stated order, but the disclosure is not limited thereto. The positions and formation sequence of the electrode patterns and/or insulating patterns that form the pixel PXL may be changed in various suitable ways depending on embodiments. Description of a stacked structure of the pixel PXL will be described below with reference to FIGS. 8 to 13.

The bank patterns BNP may be provided at least in the emission area EMA and be spaced apart from each other in the first direction DR1 in the emission area EMA, and each may extend in the second direction DR2.

Each bank pattern BNP (referred also to as "wall pattern," "protrusion pattern," "support patter," or "pattern") may have a uniform width in the emission area EA. For example, each of the first, second, and third bank patterns BNP1, BNP2, and BNP3 may have a bar-like shape having a constant width in the emission area EMA, in a plan view.

The bank patterns BNP may have an identical width or different widths. For example, the first and third bank patterns BNP1 and BNP3 may have an identical width at least in the emission area EMA and face each other with the second bank pattern BNP2 interposed therebetween. For example, the first and third bank patterns BNP1 and BNP3 may be symmetrical with each other based on the second bank pattern BNP2 in the emission area EMA.

The bank patterns BNP may be arranged at regular intervals in the emission area EMA. For example, the first, second, and third bank patterns BNP1, BNP2, and BNP3 may be successively arranged in the emission area EA at regular intervals in the first direction DR1.

Each bank pattern BNP may partially overlap at least one connection electrode BRE and at least one alignment electrode ALE at least in the emission area EMA. For example, the first bank pattern BNP1 may be provided under the first connection electrode BRE1 and overlap an area of the first connection electrode BRE1 and an area of the first alignment electrode ALE1. The second bank pattern BNP2 may be provided under the second and third connection electrode BRE2 and BRE3 and overlap an area of each of the second connection electrode BRE2 and the second alignment electrode ALE2 and an area of each of the third connection electrode BRE3 and the third alignment electrode ALE3. The third bank pattern BNP3 may be provided under the fourth connection electrode BRE4 and overlap an area of the fourth connection electrode BRE4 and an area of the fourth alignment electrode ALE4.

Since the bank patterns BNP are provided in the emission area EMA under the respective corresponding areas of the connection electrodes BRE and the alignment electrodes ALE, the respective corresponding areas of the connection electrodes BRE and the alignment electrodes ALE may protrude upward in areas where the respective bank patterns BNP are formed. Consequently, a wall structure may be formed around the light emitting elements LD. For example, the wall structure may be formed in the emission area EMA and face the first and second ends EP1 and EP2 of the light emitting elements LD.

In an embodiment, in case that the bank patterns BNP and/or the alignment electrodes ALE include a reflective material, a reflective wall structure may be formed around the light emitting elements LD. Hence, light (or rays) emitted from the light emitting elements LD may be oriented in an upward direction of the pixel PXL (e.g., in an image display direction of the display device), so that the light efficiency of the pixel PXL may be further improved.

The connection electrodes BRE may be disposed at least in the emission area EMA, and be spaced apart from each other in the first direction DR1 in the emission area EMA, and each may extend in the second direction DR2. Furthermore, the connection electrodes BRE may extend from the emission area EMA to the second and third openings OP2 and OP3 of the bank BNK via the non-emission area NEMA and be separated from the connection electrodes BRE of the pixels PXL adjacent thereto in the second direction DR2 by removing portions of the connection electrodes BRE in each of the second and third openings OP2 and OP3.

The connection electrodes BRE may include a first connection electrode BRE1, a third connection electrode BRE3, a second connection electrode BRE2, and a fourth connection electrode BRE4 which are arranged at positions spaced apart from each other in the first direction DR1. The first connection electrode BRE1 may overlap the first bank pattern BNP1. The third and second connection electrodes BRE3 and BRE2 may overlap the second bank pattern BNP2. The fourth connection electrode BRE4 may overlap the third bank pattern BNP3.

Each of the connection electrodes BRE may have a uniform width in the emission area EMA. For example, each of the first, second, third, and fourth connection electrodes BRE1, BRE2, BRE3, and BRE4 may have a bar-like shape having a constant width in the emission area EMA, in a plan view. The connection electrodes BRE may have an identical width or different widths in the first direction DR1.

The alignment electrodes ALE may be provided at least in the emission area EMA, and be spaced apart from each other in the first direction DR1 in the emission area EMA, and each may extend in the second direction DR2. Furthermore, the alignment electrodes ALE may extend from the emission area EMA to the second and third openings OP2 and OP3 of the bank BNK via the non-emission area NEMA and be separated from the alignment electrodes ALE of the pixels PXL adjacent thereto in the second direction DR2 by removing portions of the alignment electrodes ALE in each of the second and third openings OP2 and OP3.

The alignment electrodes ALE may include the first alignment electrode ALE1, the third alignment electrode ALE3, the second alignment electrode ALE2, and the fourth alignment electrode ALE4 which are arranged at positions spaced apart from each other in the first direction DR1. The first alignment electrode ALE1 may be disposed on the first connection electrode BRE1 and overlap the first connection electrode BRE1. The third alignment electrode ALE3 may be disposed on the third connection electrode BRE3 and overlap the third connection electrode BRE3. The second alignment electrode ALE2 may be disposed on the second connection electrode BRE2 and overlap the second connection electrode BRE2. The fourth alignment electrode ALE4 may be disposed on the fourth connection electrode BRE4 and overlap the fourth connection electrode BRE4.

In an embodiment, the first alignment electrode ALE1 may be directly disposed on the first connection electrode BRE1. The second alignment electrode ALE2 may be directly disposed on the second connection electrode BRE2. The third alignment electrode ALE3 may be directly disposed on the third connection electrode BRE3. The fourth alignment electrode ALE4 may be directly disposed on the fourth connection electrode BRE4.

The alignment electrodes ALE and the connection electrodes BRE may be referred to as upper electrodes and lower electrodes depending on positions thereof. For example, the first alignment electrode ALE1 may be referred to as a first upper electrode, the first connection electrode BRE1 may be referred to as a first lower electrode, the second alignment electrode ALE2 may be referred to as a second upper electrode, the second connection electrode BRE2 may be referred to as a second lower electrode, the third alignment electrode ALE3 may be referred to as a third upper electrode, the third connection electrode BRE3 may be referred to as a third lower electrode, the fourth alignment electrode ALE4 may be referred to as a fourth upper electrode, and the fourth connection electrode BRE4 may be referred to as a fourth lower electrode.

The first alignment electrode ALE1 (or the first upper electrode) and the first connection electrode BRE1 (or the first lower electrode) may have a same planar shape (or same shape in a plan view) in the emission area EMA and the third opening OP3 (or the electrode separation area). The third alignment electrode ALE3 (or the third upper electrode) and the third connection electrode BRE3 (or the third lower electrode) may have a same planar shape in the emission area EMA, the second opening OP2 (or an electrode separation area), and the third opening OP3. The second alignment electrode ALE2 (or the second upper electrode) and the second connection electrode BRE2 (or the second lower electrode) may have a same planar shape in the emission area EMA and the third opening OP3. The fourth alignment electrode ALE4 (or the fourth upper electrode) and the fourth connection electrode BRE4 (or the fourth lower electrode) may have a same planar shape in the emission area EMA, the second opening OP2, and the third opening OP3.

In an embodiment, the first alignment electrode ALE1 and the first connection electrode BRE1 disposed thereunder may have different planar shapes in the second opening OP2. Furthermore, the second alignment electrode ALE2 and the second connection electrode BRE2 disposed thereunder may have different planar shapes in the second opening OP2. Detailed descriptions thereof will be made with reference to FIGS. 14 to 16.

One of the connection electrodes BRE and the alignment electrodes ALE or the other may be electrically connected to the pixel circuit PXC of the corresponding pixel PXL and/or a power line through a contact portion CNT. For example, the first connection electrode BRE1 and the first alignment electrode ALE1 may be electrically connected to the pixel circuit PXC and/or the first power line PL1 through a first contact portion CNT1. The second connection electrode BRE2 and the second alignment electrode ALE2 may be electrically connected to the second power line PL2 through a second contact portion CNT2.

In an embodiment, the first contact portion CNT1 and the second contact portion CNT2 may be disposed in the non-emission area NEMA and overlap the bank BNK. However, the disclosure is not limited thereto. In an embodiment, the first and second contact portions CNT1 and CNT2 may be disposed in the second opening OP2 that is an electrode separation area.

A pair of alignment electrodes ALE adjacent to each other may be supplied with different signals at the step of aligning the light emitting elements LD and be spaced apart from each other by a uniform distance in the emission area EMA. Furthermore, in case that at least two pairs of alignment electrodes ALE are provided in the emission area EMA, each pair of alignment elements ALE may be spaced apart from each other by an identical distance. For example, the first and third alignment electrodes ALE1 and ALE3 may form a pair and be supplied with different alignment signals, and the second and fourth alignment electrodes ALE2 and ALE4 may form a pair and be supplied with different alignment signals. In this case, in the emission area EMA, the first and third alignment electrodes ALE1 and ALE3 may be spaced apart from each other by a predetermined distance in the first direction DR1, and the second and fourth alignment electrodes ALE2 and ALE4 may also be spaced apart from each other by a constant distance in the first direction DR1.

The second and third alignment electrodes ALE2 and ALE3 may be supplied with an identical signal at the step of aligning the light emitting elements LD. The second and third alignment electrodes ALE2 and ALE3 may be integrally formed (or integral with each other) or non-integrally connected to each other at the step of aligning the light emitting elements LD.

The foregoing alignment signals may be signals having a voltage difference and/or a phase difference to align the light emitting elements LD between the alignment electrodes ALE. At least one of the alignment signals may be an AC signal (or voltage), but the disclosure is not limited thereto.

Each alignment electrode ALE may or may not have a bent portion in the non-emission area NEMA and/or the electrode separation areas (or the second and third openings OP2 and OP3), and the shape and/or size thereof in areas other than the emission area EMA may be changed in various suitable ways rather than being limited. For example, each of the first alignment electrode ALE1 and the second alignment electrode ALE2 may be designed to have, by removing an area thereof in the second opening OP2 that is an electrode separation area, a shape in which the first connection electrode BRE1 and the second connection electrode BRE2 that are disposed thereunder are exposed to the outside. In detail, the first alignment electrode ALE1 may be designed to have, by removing an area thereof corresponding to a first contact hole CH1 in the second opening OP2, a shape in which the first connection electrode BRE1 disposed thereunder is exposed to the outside. The second alignment electrode ALE2 may be designed to have, by removing an area thereof corresponding to a second contact hole CH2 in the second opening OP2, a shape in which the second connection electrode BRE2 disposed thereunder is exposed to the outside.

In an embodiment, the first alignment electrode ALE1 may be electrically connected to the first pixel electrode ELT1 through the first connection electrode BRE1 disposed thereunder. Furthermore, the second alignment electrode ALE2 may be electrically connected to the second pixel electrode ELT2 through the second connection electrode BRE2 disposed thereunder. For example, the first connection electrode BRE1 the area of which is exposed through the first contact hole CH1 may be electrically connected to the first pixel electrode ELT1 provided over the first contact hole CH1. For example, the second connection electrode BRE2 the area of which is exposed through the second contact hole CH2 may be electrically connected to the second pixel electrode ELT2 provided over the second contact hole CH2.

The first contact hole CH1 and the second contact hole CH2 for electrically connecting the connection electrodes BRE and the alignment electrodes ALE to the corresponding pixel electrodes ELT may be disposed in the second opening OP2 that is an electrode separation area. The first contact hole CH1 and the second contact hole CH2 may be disposed in the second opening OP2 and be formed by removing portions of at least one insulating layer disposed between the connection electrodes BRE, the alignment electrodes ALE, and the pixel electrodes ELT.

Although at least two to several tens of light emitting elements LD may be aligned and/or provided in the emission area EMA (or the pixel area PXA), the number of light emitting elements LD is not limited thereto. In an embodiment, the number of light emitting elements LD aligned and/or provided in the emission area EMA (or the pixel area PXA) may be changed in various suitable ways.

The light emitting elements LD may include a first light emitting element LD1, a second light emitting element LD2, a third light emitting element LD3, and a fourth light emitting element LD4.

The first light emitting element LD1 may be aligned between the first alignment electrode ALE1 and the third alignment electrode ALE3 and electrically connected between the first pixel electrode ELT1 and the first intermediate electrode CTE1. The second light emitting element LD2 may be aligned between the first alignment electrode ALE1 and the third alignment electrode ALE3 and electrically connected between the first intermediate electrode CTE1 and the second intermediate electrode CTE2. In a plan view, the first light emitting element LD1 may be aligned in an upper end of an area between the first alignment electrode ALE1 and the third alignment electrode ALE3, and the second light emitting element LD2 may be aligned in a lower end of the area.

In an embodiment, first light emitting elements LD1 and second light emitting elements LD2 may be provided. The first end EP1 of each of the first light emitting elements LD1 may be electrically connected to the first pixel electrode ELT1. The second end EP2 of each of the first light emitting elements LD1 may be electrically connected to the first intermediate electrode CTE1. The first end EP1 of each of the second light emitting elements LD2 may be electrically connected to the first intermediate electrode CTE1. The second end EP2 of each of the second light emitting elements LD2 may be electrically connected to the second intermediate electrode CTE2.

The third light emitting element LD3 may be aligned between the second alignment electrode ALE2 and the fourth alignment electrode ALE4 and electrically connected between the second intermediate electrode CTE2 and the third intermediate electrode CTE3. The fourth light emitting element LD4 may be aligned between the second alignment electrode ALE2 and the fourth alignment electrode ALE4 and electrically connected between the third intermediate electrode CTE3 and the second pixel electrode ELT2. In a plan view, the third light emitting element LD3 may be aligned in a lower end of an area between the second alignment electrode ALE2 and the fourth alignment electrode ALE4, and the fourth light emitting element LD4 may be aligned in an upper end of the area.

In an embodiment, third light emitting elements LD3 and fourth light emitting elements LD4 may be provided. The first end EP1 of each of the third light emitting elements LD3 may be electrically connected to the second intermediate electrode CTE2. The second end EP2 of each of the third light emitting elements LD3 may be electrically connected to the third intermediate electrode CTE3. The first end EP1 of each of the fourth light emitting elements LD4 may be electrically connected to the third intermediate electrode CTE3. The second end EP2 of each of the fourth light emitting elements LD4 may be electrically connected to the second pixel electrode ELT2.

As described above, in a plan view, the first light emitting elements LD1 may be disposed in a left upper end of the emission area EMA, the second light emitting elements LD2 may be disposed in a left lower end of the emission area EMA, the third light emitting elements LD3 may be disposed in a right lower end of the emission area EMA, and the fourth light emitting elements LD4 may be disposed in a right upper end of the emission area EMA. The arrangement and/or connection structure of the light emitting elements LD is not limited to the foregoing embodiment. In an embodiment, the arrangement and/or connection structure of the light emitting elements LD may be changed in various suitable ways depending on components included in the emission unit EMU and/or the number of serial sets (or stages).

The first light emitting elements LD1 may be electrically connected in parallel with each other between the first pixel electrode ELT1 and the first intermediate electrode CTE1, and form the first serial stage SET1. The second light emitting elements LD2 may be electrically connected in parallel with each other between the first intermediate electrode CTE1 and the second intermediate electrode CTE2, and form the second serial stage SET2. The third light emitting elements LD3 may be electrically connected in parallel with each other between the second intermediate electrode CTE2 and the third intermediate electrode CTE3, and form the third serial stage SET3. The fourth light emitting elements LD4 may be electrically connected in parallel with each other between the third intermediate electrode CTE3 and the second pixel electrode ELT2, and form the fourth serial stage SET4.

In an embodiment, the first light emitting element LD1, the second light emitting element LD2, the third light emitting element LD3, and the fourth light emitting element LD4 each may be a light emitting diode which is made of material having an inorganic crystal structure and has a subminiature size, e.g., ranging from the nanometer scale to the micrometer scale. For example, the first light emitting element LD1, the second light emitting element LD2, the third light emitting element LD3, and the fourth light emitting element LD4 each may be the light emitting element LD described with reference to FIGS. 1 to 3.

The pixel electrodes ELT and the intermediate electrodes CTE may be provided at least in the emission area EMA, and each may be provided at a position corresponding to at least one alignment electrode ALE and at least one light emitting element LD. For example, each pixel electrode ELT and each intermediate electrode CTE may be formed on the corresponding alignment electrodes ALE and the corresponding light emitting elements LD to overlap the alignment electrodes ALE and the light emitting elements LD, and thus electrically connected to at least the light emitting elements LD.

The first pixel electrode ELT1 may be formed on an area (e.g., an upper area) of the first alignment electrode ALE1 and the respective first ends EP1 of the first light emitting elements LD1, and thus electrically connected to the respective first ends EP1 of the first light emitting elements LD1.

The second pixel electrode ELT2 may be formed on an area (e.g., an upper area) of the second alignment electrode ALE2 and the respective second ends EP2 of the fourth light emitting elements LD4, and thus electrically connected to the respective second ends EP2 of the fourth light emitting elements LD4.

Furthermore, the second pixel electrode ELT2 may be electrically connected to the first, second, and third light emitting elements LD1, LD2, and LD3 via at least one intermediate electrode CTE and/or the light emitting elements LD. For example, the second pixel electrode ELT2 may be electrically connected to the second end EP2 of each first light emitting element LD1 via the first intermediate electrode CTE1, the second light emitting element LD2, the second intermediate electrode CTE2, the third light emitting element LD3, the third intermediate electrode CTE3, and the fourth light emitting element LD4.

The first intermediate electrode CTE1 may be formed on an area (e.g., an upper area) of the third alignment electrode ALE3 and the respective second ends EP2 of the first light emitting elements LD1, and thus electrically connected to the second end EP2 of each first light emitting element LD1. Furthermore, the first intermediate electrode CTE1 may be formed on another area (e.g., a lower area) of the first alignment electrode ALE1 and the respective first ends EP1 of the second light emitting elements LD2, and thus electrically connected to the first end EP1 of each second light emitting element LD2. The first intermediate electrode CTE1 may be a first bridge electrode which electrically connects the first serial set SET1 and the second serial set SET2.

To this end, the first intermediate electrode CTE1 may be bent at least one or more times. For example, the first intermediate electrode CTE1 may be bent, folded, or curved at least one or more times in an area (or a boundary) between an area where at least one first light emitting element LD1 is disposed and an area where at least one second light emitting element LD2 is disposed, but the disclosure is not limited thereto. In an embodiment, the shapes of the first intermediate electrode CTE1 may be changed in various suitable shapes, so long as the first intermediate electrode CTE1 may reliably electrically connect the first serial set SET1 and the second serial set SET2 that are successively provided.

The first intermediate electrode CTE1 may be disposed between the first pixel electrode ELT1 and the second pixel electrode ELT2 and electrically connected between the first pixel electrode ELT1 and the second pixel electrode ELT2 through the light emitting elements LD. For example, the first intermediate electrode CTE1 may be electrically connected to the first pixel electrode ELT1 through at least one first light emitting element LD1, and electrically connected to the second pixel electrode ELT2 through at least one second, third, and/or fourth light emitting element LD2, LD3, and/or LD4.

The second intermediate electrode CTE2 may be formed on another area (e.g., a lower area) of the third alignment electrode ALE3 and the respective second ends EP2 of the second light emitting elements LD2, and thus electrically connected to the second end EP2 of each second light emitting element LD2. Furthermore, the second intermediate electrode CTE2 may be formed on an area (e.g., a lower area) of the fourth alignment electrode ALE4 and the respective first ends EP1 of the third light emitting elements LD3, and thus electrically connected to the first end EP1 of each third light emitting element LD3. For example, the second intermediate electrode CTE2 may be electrically connected, in the emission area EMA, to the respective second ends EP2 of the second light emitting elements LD2 and the respective first ends EP1 of the third light emitting elements LD3. The second intermediate electrode CTE2 may be a second bridge electrode which electrically connects the second serial set SET2 and the third serial set SET3.

To this end, the second intermediate electrode CTE2 may be bent at least one or more times. For example, the second intermediate electrode CTE2 may have a bent or curved shape in or around a boundary (or an area) between an area where at least one second light emitting element LD2 is disposed and an area where at least one third light emitting element LD3 is disposed, but the disclosure is not limited thereto. In an embodiment, the shape of the second intermediate electrode CTE2 may be changed in various ways, so long as the second intermediate electrode CTE2 may reliably electrically connect the second serial set SET2 and the third serial set SET3 that are successively provided. In an embodiment, the second intermediate electrode CTE2 may be disposed only in the emission area EMA rather than extending to the second and third openings OP2 and OP3 that are electrode separation areas, but the disclosure is not limited thereto.

Furthermore, the second intermediate electrode CTE2 may be electrically connected between the first and second pixel electrodes ELT1 and ELT2 through the light emitting elements LD. For example, the second intermediate electrode CTE2 may be electrically connected to the first pixel electrode ELT1 through at least one first and/or second light emitting element LD1 and/or LD2, and electrically connected to the second pixel electrode ELT2 through at least one third and/or fourth light emitting element LD3 and/or LD4.

The third intermediate electrode CTE3 may be formed on another area (e.g., a lower area) of the second alignment electrode ALE2 and the respective second ends EP2 of the third light emitting elements LD3, and thus be electrically connected to the second end EP2 of each third light emitting element LD3. Furthermore, the third intermediate electrode CTE3 may be formed on another area (e.g., an upper area) of the fourth alignment electrode ALE4 and the respective first ends EP1 of the fourth light emitting elements LD4, and thus electrically connected to the first end EP1 of each fourth light emitting element LD4. For example, the third intermediate electrode CTE3 may be electrically connected, in the emission area EMA, to the respective second ends EP2 of the third light emitting elements LD3 and the respective first ends EP1 of the fourth light emitting elements LD4. The third intermediate electrode CTE3 may be a third bridge electrode which electrically connects the third serial set SET3 and the fourth serial set SET4.

To this end, the third intermediate electrode CTE3 may be bent at least one or more times. For example, the third intermediate electrode CTE3 may be bent, folded, or curved in an area (or a boundary) between an area where at least one third light emitting element LD3 is disposed and an area where at least one fourth light emitting element LD4 is disposed, but the disclosure is not limited thereto. In an embodiment, the shape of the third intermediate electrode CTE3 may be changed in various ways, so long as the third intermediate electrode CTE3 may reliably electrically connect the third serial set SET3 and the fourth serial set SET4 that are successively provided.

Furthermore, the third intermediate electrode CTE3 may be electrically connected between the first pixel electrode ELT1 and the second pixel electrode ELT2 through the light emitting elements LD. For example, the third intermediate electrode CTE3 may be electrically connected to the first pixel electrode ELT1 through at least one first, second, and/or third light emitting element LD1, LD2 and/or LD3, and electrically connected to the second pixel electrode ELT2 through at least one fourth light emitting element LD4.

The first to third intermediate electrodes CTE1, CTE2, and CTE3 each may be an electrode to which a predetermined signal (or voltage) is not directly applied from an external device.

As described above, the first light emitting element LD1 may be electrically connected in series to the second light emitting element LD2 through the first intermediate electrode CTE1. The second light emitting element LD2 may be electrically connected in series to the third light emitting element LD3 through the second intermediate electrode CTE2. The third light emitting element LD3 may be electrically connected in series to the fourth light emitting element LD4 through the third intermediate electrode CTE3.

In the pixel PXL during each frame period, driving current may flow from the first pixel electrode ELT1 to the second pixel electrode ELT2 via the first light emitting element LD1, the first intermediate electrode CTE1, the second light emitting element LD2, the second intermediate electrode CTE2, the third light emitting element LD3, the third intermediate electrode CTE3, and the fourth light emitting element LD4.

The first light emitting element LD1, the second light emitting element LD2, the third light emitting element LD3, and the fourth light emitting element LD4 may be electrically connected in series between first pixel electrode ELT1 and the second pixel electrode ELT2 through the first intermediate electrode CTE1, the second intermediate electrode CTE2, and the third intermediate electrode CTE3. In this way, the light emitting elements LD aligned in the emission area EMA may be electrically connected in a serial-parallel combination structure to form the emission unit EMU of the pixel PXL. Hence, it is possible to minimize a surface area occupied by the alignment electrode ALE (or prevent the number of alignment electrodes ALE from increasing) and also form the emission unit EMU having a serial-parallel combination structure including four serial stages SET1, SET2, SET3, and SET4, so that a high-resolution and high-definition display device may be easily implemented.

In an embodiment, at least one pixel electrode ELT may extend from the emission area EMA to the second opening OP2 and/or third opening OP3, which is an electrode separation area, via the non-emission area NEMA, and be electrically connected to any one connection electrode BRE through a contact hole CH in the electrode separation area. For example, the first pixel electrode ELT1 may extend from the emission area EMA to the second opening OP2 and be electrically connected, in the second opening OP2, to the first connection electrode BRE1 exposed through the first contact hole CH1. The first pixel electrode ELT1 electrically connected with the first connection electrode BRE1 may be electrically connected with the first alignment electrode ALE1 through the first connection electrode BRE1. The second pixel electrode ELT2 may extend from the emission area EMA to the second opening OP2 and be electrically connected, in the second opening OP2, to the second connection electrode BRE2 exposed through the second contact hole CH2. The second pixel electrode ELT2 electrically connected with the second connection electrode BRE2 may be electrically connected with the second alignment electrode ALE2 through the second connection electrode BRE2.

In accordance with the embodiments described above, the connection electrode BRE and the pixel electrode ELT are electrically connected with each other by directly contacting each other through the contact hole CH. Hence, even if the alignment electrode ALE is oxidized during a fabrication process, contact resistance of the pixel electrode ELT may not increase because the pixel electrode ELT does not directly contact the alignment electrode ALE. Therefore, the reliability of the pixel electrode ELT may be enhanced, so that in case that signals (or voltages) are supplied to the light emitting elements LD, distortion attributable to a signal delay may be mitigated or minimized, whereby the light emitting elements LD may be more reliably driven. Consequently, the reliability of the display device may be improved.

Hereinafter, the stacked structure of the pixel PXL in accordance with the foregoing embodiment will be mainly described with reference to FIGS. 8 to 13.

Figure 11:
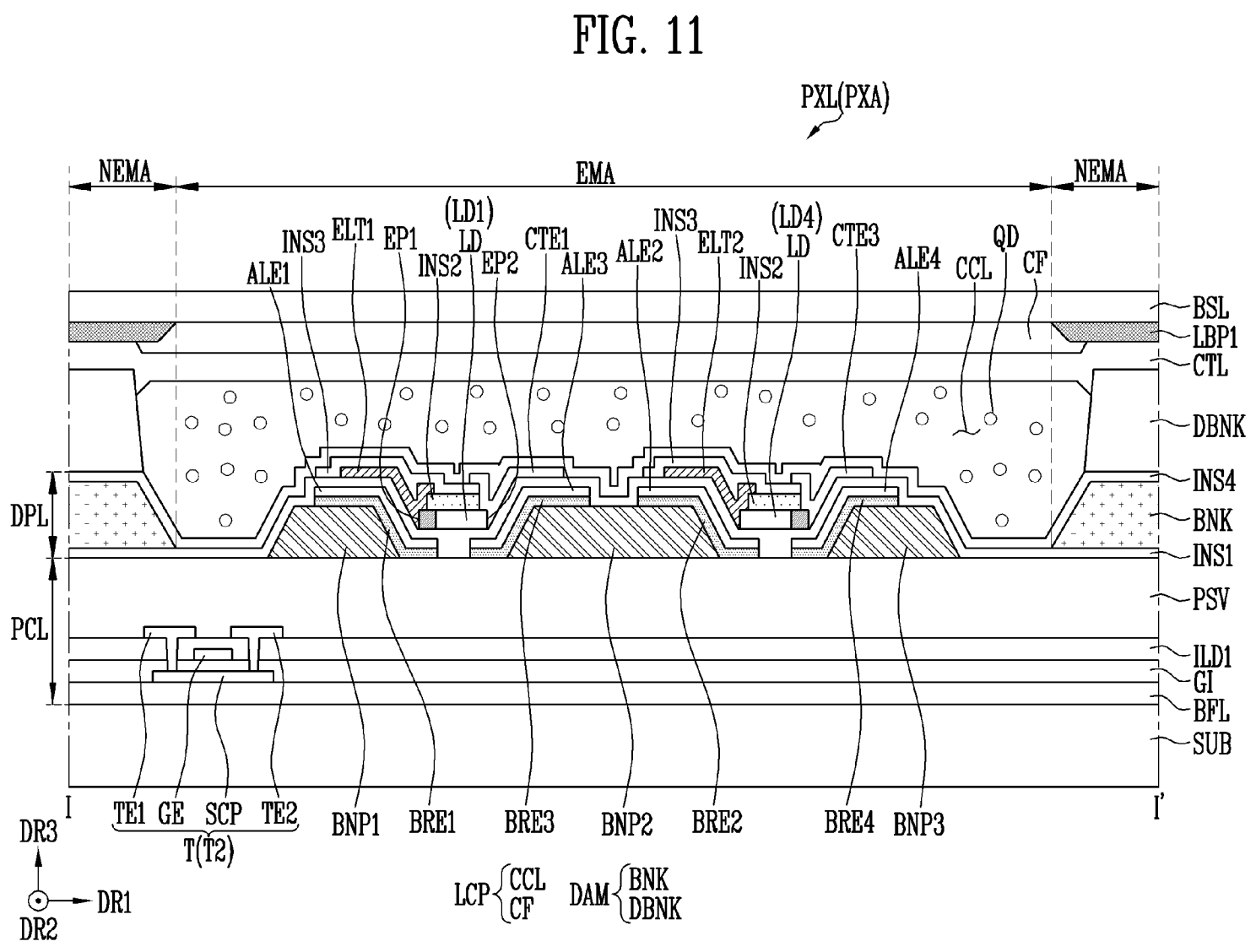
Figure 12:
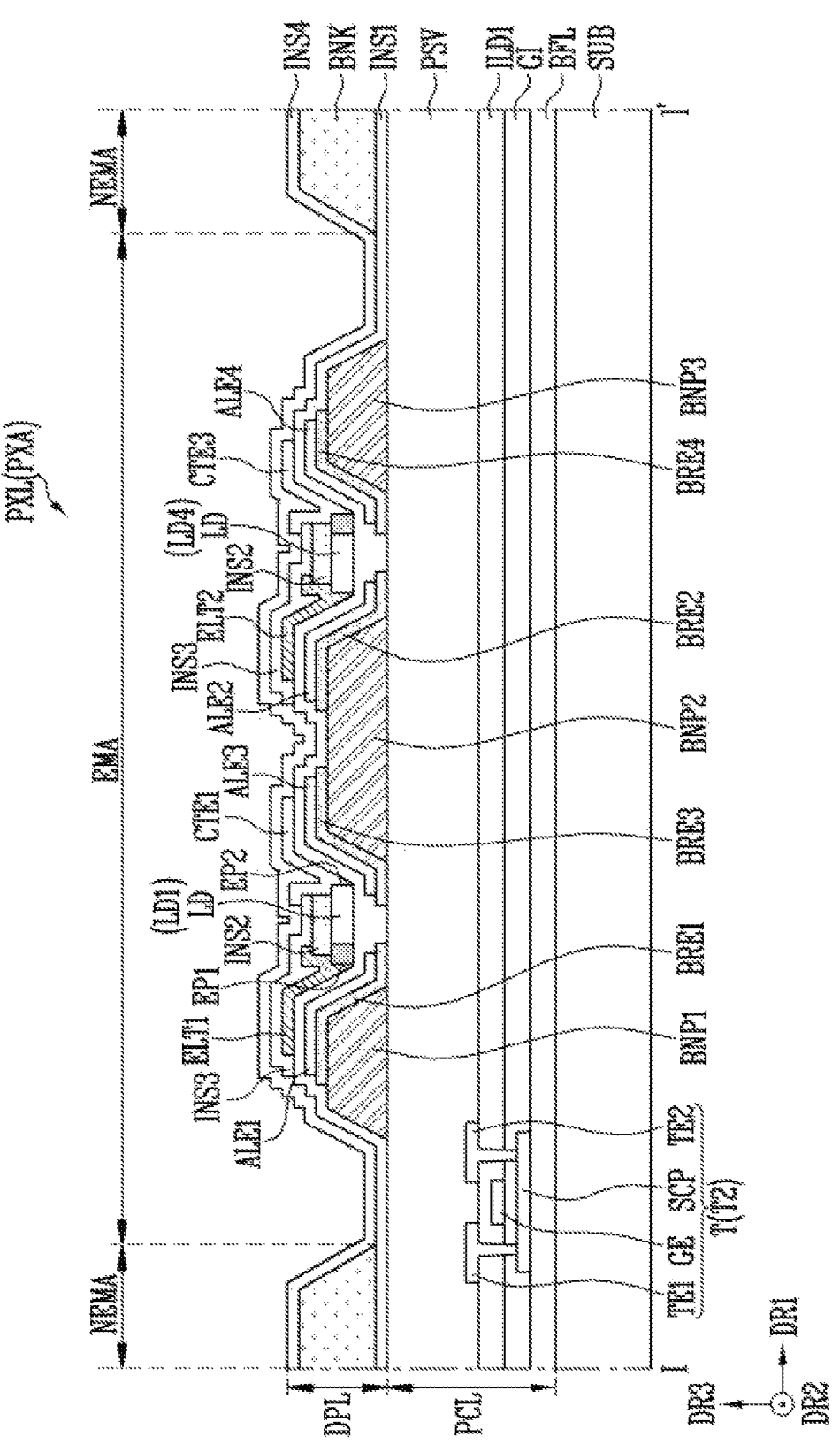
Figure 13:
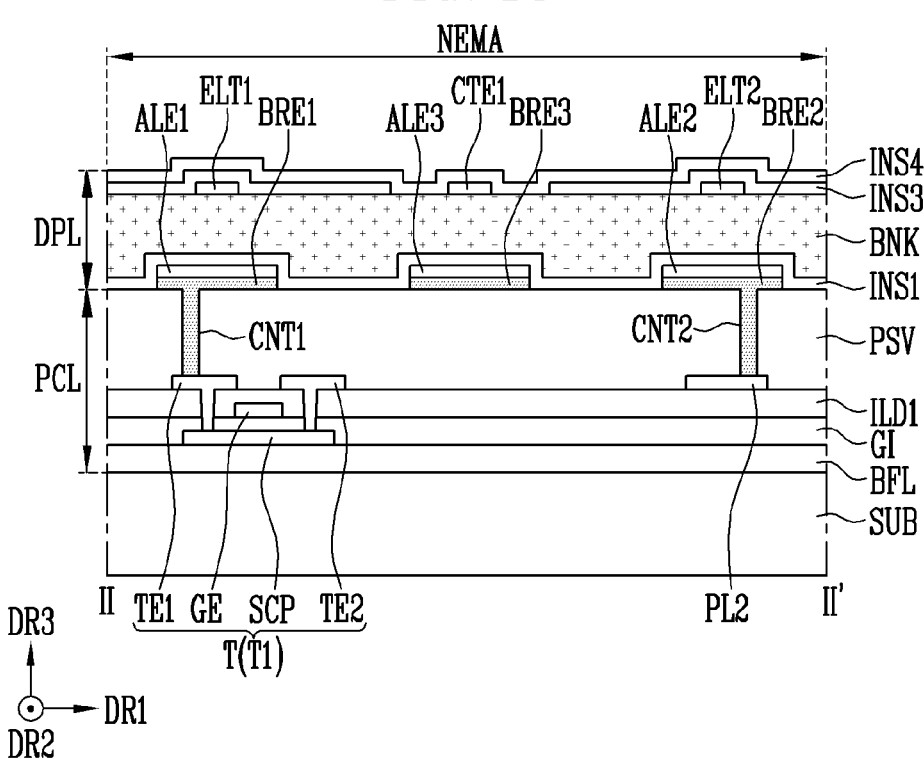
FIG. 13 is a schematic cross-sectional view taken along line II-II' of FIG. 6.

FIGS. 8 to 12 are schematic sectional views taken along line I-I' of FIG. 6, and FIG. 13 is a schematic cross-sectional view taken along line II-II' of FIG. 6.

In the description of embodiments, "components are provided and/or formed on the same layer" may mean that the components are formed by the same process, and "components are provided and/or formed on different layers may mean that the components are formed by different processes.

Figure 8:
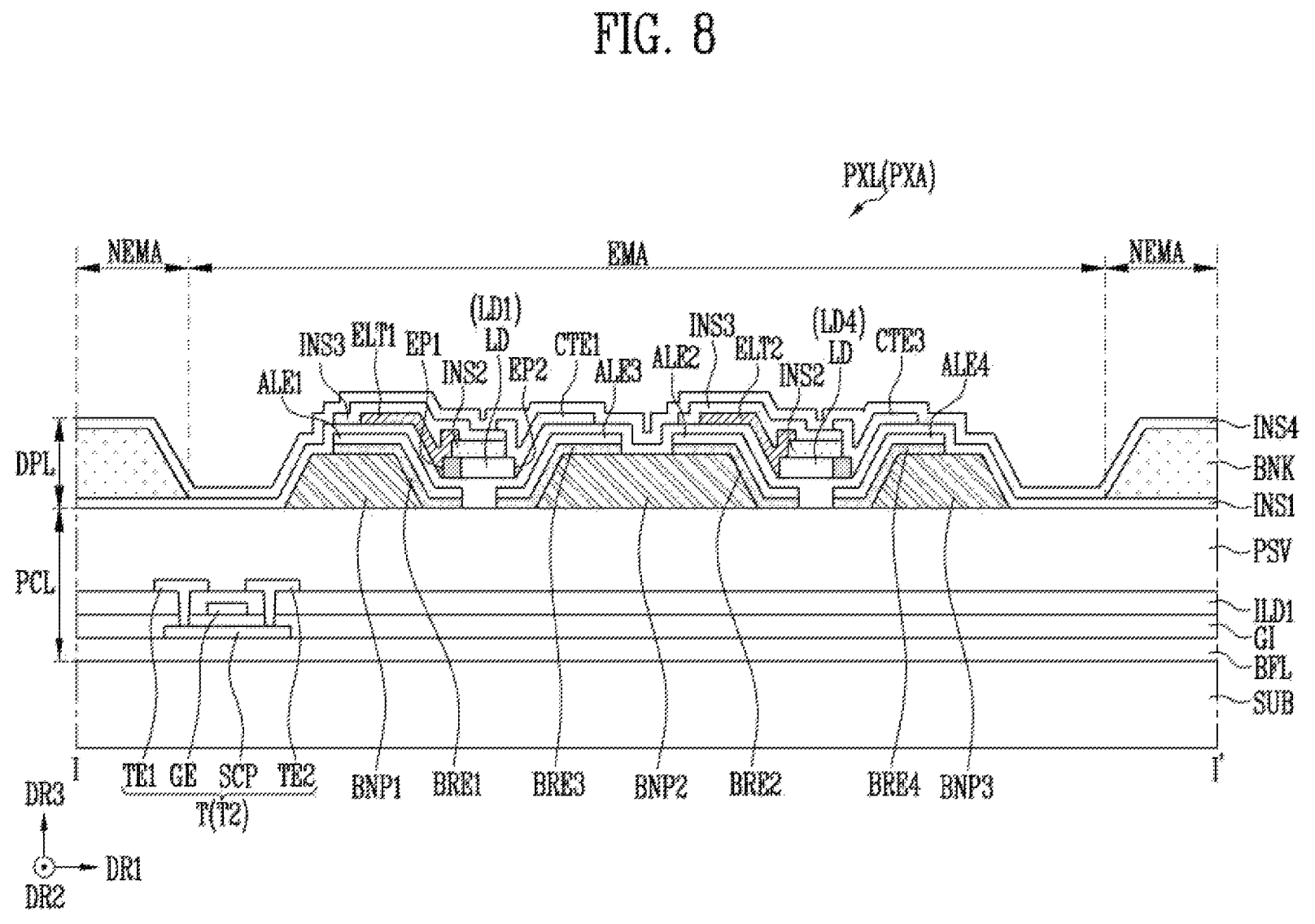
Figure 9:
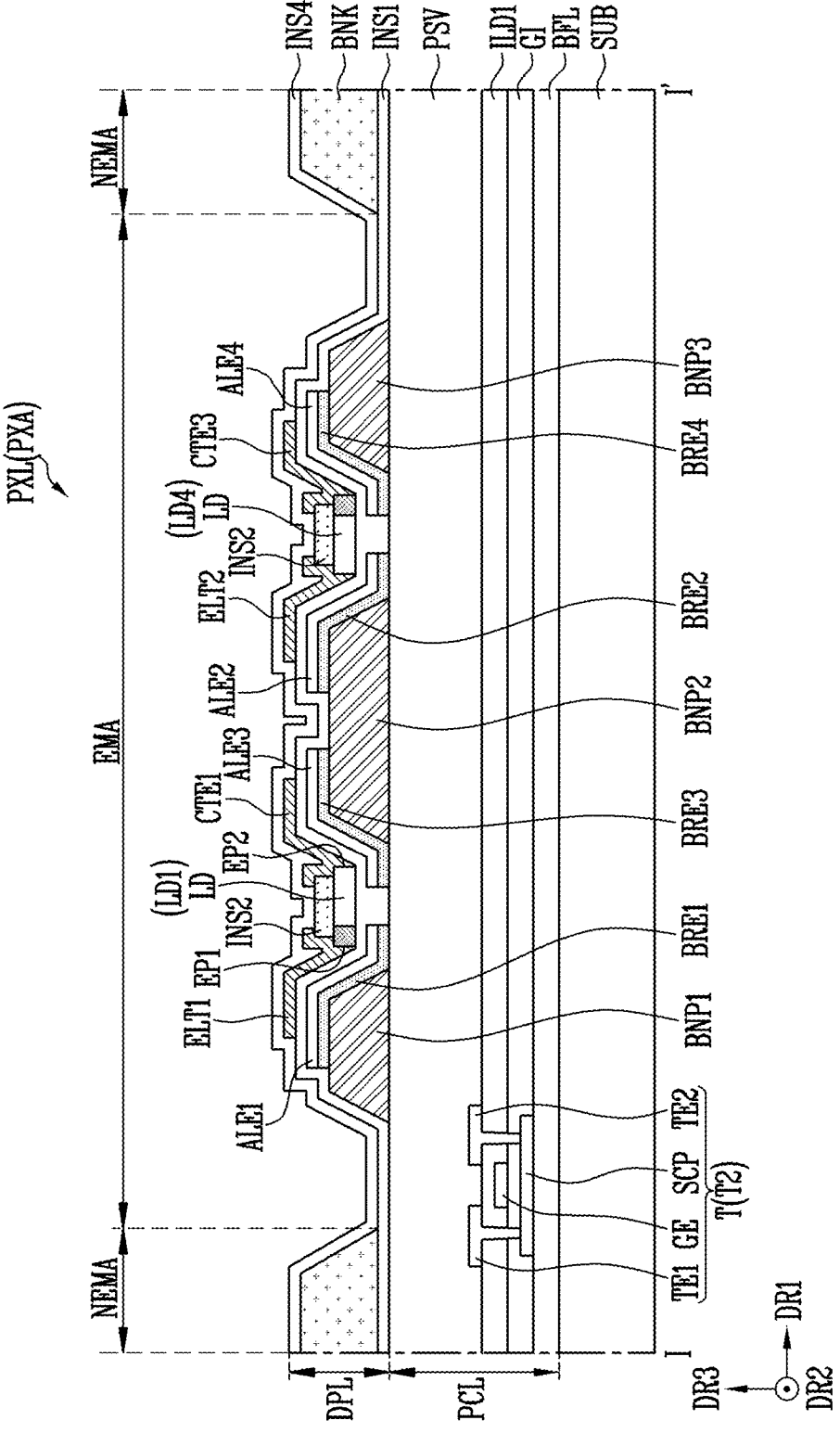
Figure 10:
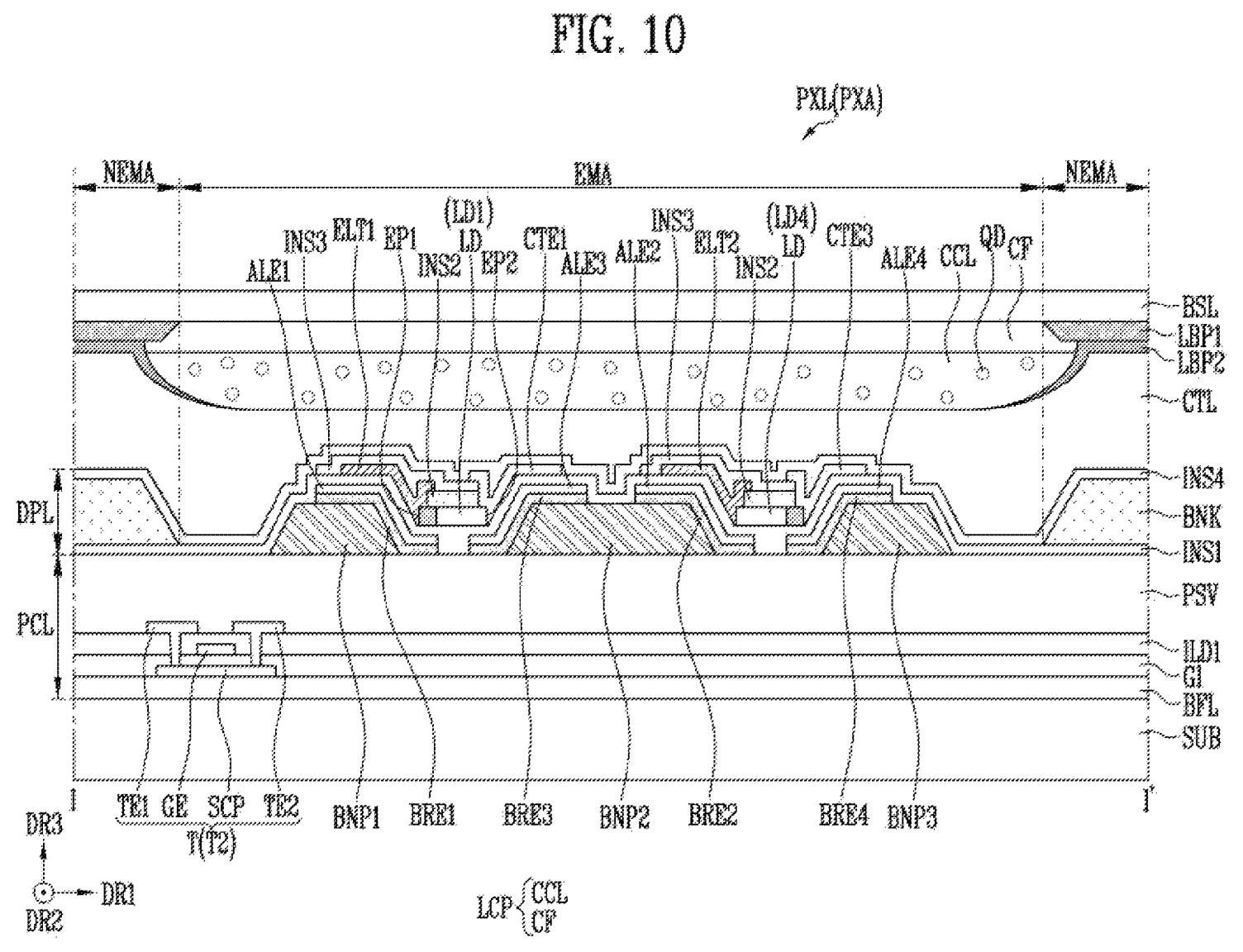

Embodiments of FIGS. 8 and 9 are directed to different embodiments pertaining both to the step of forming the pixel electrode ELT and the intermediate electrode CTE and to whether the third insulating layer INS3 is present. For example, FIG. 8 illustrates an embodiment where intermediate electrodes CTE are formed after the pixel electrodes ELT and the third insulating layer INS3 have been formed. FIG. 9 illustrates an embodiment where the pixel electrodes ELT and the intermediate electrodes CTE are formed on an identical layer. FIGS. 10 and 11 illustrate modified embodiments pertaining to the embodiment of FIG. 8 with respect to a position, a formation sequence, and/or a shape of a light conversion pattern LCP. FIG. 12 illustrates another modified embodiment pertaining to the embodiment of FIG. 8 with respect to shapes of the connection electrodes BRE and the alignments ALE.

Although FIGS. 8 to 13 simply illustrate a pixel PXL, e.g., illustrating that each electrode is formed of an electrode having a single-layer (or single-film) structure and each insulating layer is formed of an insulating layer having a single-layer (or single-film) structure, the disclosure is not limited thereto.

In FIGS. 8 to 13, a transverse direction (or a horizontal direction) in a sectional view is indicated by a first direction DR1, a height-wise direction (or a vertical direction) in a sectional view is indicated by a third direction DR3, and a direction perpendicular to the first and third directions DR1 and DR3 is indicated by a second direction DR2. The first to third directions DR1, DR2, and DR3 may refer to the directions indicated by the first to third directions DR1, DR2, and DR3, respectively.

Referring to FIGS. 4 to 13, the pixel PXL may include a substrate SUB, a pixel circuit layer PCL, and a display element layer DPL. The pixel circuit layer PCL and the display element layer DPL may be disposed on a surface of the substrate SUB and overlap each other. For example, the display area DA of the substrate SUB may include the pixel circuit layer PCL disposed on the surface of the substrate SUB, and the display element layer DPL disposed on the pixel circuit layer PCL. However, relative positions of the pixel circuit layer PCL and the display element layer DPL on the substrate SUB may be changed depending on embodiments. In case that the pixel circuit layer PCL and the display element layer DPL are separated from each other as separate layers and overlap each other, layout space sufficient to form each of the pixel circuit PXC and the emission unit EMU may be secured.

The substrate SUB may include a transparent insulating material to allow light transmission. The substrate SUB may be a rigid substrate or a flexible substrate.

For example, the rigid substrate SUB may be one of an organic substrate, a quartz substrate, a glass ceramic substrate, and a crystalline glass substrate.

The flexible substrate SUB may be either a film substrate or a plastic substrate which includes polymer organic material. For example, the flexible substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

In each pixel area PXA of the pixel circuit layer PCL, circuit elements (e.g., transistors T and a storage capacitor Cst) for forming the pixel circuit PXC of the corresponding pixel PXL and signal lines electrically connected to the circuit elements may be disposed. Furthermore, in each pixel area PXA of the display circuit layer DPL, the connection electrodes BRE, the alignment electrodes ALE, the light emitting elements LD, and/or the pixel electrodes ELT that form the emission unit EMU of the corresponding pixel PXL may be disposed.

The pixel circuit layer PCL may include at least one insulating layer as well as the circuit elements and the signal lines. For example, the pixel circuit layer PCL may include a buffer layer BFL, a gate insulating layer GI, an interlayer insulating layer ILD, and a passivation layer PSV which are successively stacked in the third direction DR3.

The buffer layer BFL may prevent impurities from diffusing into the transistors T included in the pixel circuit PXC. The buffer layer BFL may be an inorganic insulating layer formed of an inorganic material. The buffer layer BFL may include at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided in a single layer structure or a multi-layer structure having at least two or more layers. In case that the buffer layer BFL has a multi-layer structure, the respective layers may be formed of the same material or different materials. The buffer layer BFL may be omitted depending on the material of the substrate SUB or processing conditions.

The transistors T may include a first transistor T1 (or a driving transistor) configured to control driving current of the light emitting elements LD, and a second transistor T2 (or a switching transistor) electrically connected to the first transistor T1. However, the disclosure is not limited thereto. The pixel circuit PXC may further include circuit elements configured to perform other functions, as well as the first transistor T1 and the second transistor T2. In the following embodiments, the first transistor T1 and the second transistor T2 may be referred to as "transistor T" or "transistors T."

The transistors T may include a semiconductor pattern SCP, a gate electrode GE, a first terminal TE1, and a second terminal TE2. The first terminal TE1 may be either a source electrode or a drain electrode, and the second terminal TE2 may be the other electrode of the source electrode and the drain electrode. For example, in case that the first terminal TE1 is a drain electrode, the second terminal TE2 may be a source electrode.

The semiconductor pattern SCP may be provided and/or formed on the buffer layer BFL. The semiconductor pattern SCP may include a first contact area which contacts the first terminal TE1, and a second contact area which contacts the second terminal TE2. An area between the first contact area and the second contact area may be a channel area. The channel area may overlap the gate electrode GE of the corresponding transistor T. The semiconductor pattern SCP may be a semiconductor pattern formed of polysilicon, amorphous silicon, an oxide semiconductor, etc. For example, the channel area may be a semiconductor pattern undoped with impurities and be an intrinsic semiconductor. Each of the first contact area and the second area may be a semiconductor pattern doped with impurities.

The gate electrode GE may be provided and/or formed on the gate insulating layer GI to correspond to the channel area of the semiconductor pattern SCP. The gate electrode GE may be provided on the gate insulating layer GI and overlap the channel area of the semiconductor pattern SCP. The gate electrode GE may have a single-layer structure formed of at least one selected from the group consisting of copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag) to reduce line resistance.

The gate insulating layer GI may be an inorganic insulating layer including an inorganic material. For example, the gate insulating layer GI may include at least one of metal oxides such as silicon nitride ($SiN_x$), silicon oxide ($SiO_x$), silicon oxynitride ($SiO_xN_y$), and aluminum oxide ($AlO_x$). However, the material of the gate insulating layer GI is not limited to that of the foregoing embodiments. In an embodiment, the gate insulating layer GI may be formed of an organic insulating layer including an organic material. Although the gate insulating layer GI may be provided in a single-layer structure, the gate insulating layer GI may be provided in a multi-layer structure having at least two or more layers.

The first terminal TE1 and the second terminal TE2 each may be provided and/or formed on the interlayer insulating layer ILD and may respectively contact the first contact area and the second contact area of the semiconductor pattern SCP through passing holes successively passing through the gate insulating layer GI and the interlayer insulating layer ILD. For example, the first terminal TE1 may contact the first contact area of the semiconductor pattern SCP, and the second terminal TE2 may contact the second contact area of the semiconductor pattern SCP. Each of the first and second terminals TE1 and TE2 and the gate electrode GE may include the same material, or each of the first and second terminals TE1 and TE2 may include one or more materials selected from among materials that may form the gate electrode GE.

The interlayer insulating layer ILD and the gate insulating layer GI may include the same material, or the interlayer insulating layer ILD may include one or more materials selected from among materials that may form the gate insulating layer GI.

Although in the foregoing embodiment the first and second terminals TE1 and TE2 of the transistors T have been described as being separate electrodes which are electrically connected with the semiconductor pattern SCP through a through hole successively passing through the gate insulating layer GI and the interlayer insulating layer ILD, the disclosure is not limited thereto. In an embodiment, the first terminal TE1 of each of the transistors T may be a first contact area adjacent to the channel area of the corresponding semiconductor pattern SCP. The second terminal TE2 of each of the transistors T may be a second contact area adjacent to the channel area of the corresponding semiconductor pattern SCP. In this case, the first terminal TE1 of the first transistor T1 that is a driving transistor, may be electrically connected to the light emitting elements LD through a separate connector such as a bridge electrode.

In an embodiment, the transistors T may be low-temperature polycrystalline silicon thin-film transistors, but the disclosure is not limited thereto. In an embodiment, the transistors T each may be formed of an oxide semiconductor thin-film transistor. Furthermore, although in the foregoing embodiment there has been illustrated the case where each of the transistors T is a thin-film transistor having a top gate structure, the disclosure is not limited thereto. The structure of the transistors T may be changed in various suitable ways.

In an embodiment, a bottom metal layer that overlap the first transistor T1 may be provided and/or formed between the substrate SUB and the buffer layer BFL. The bottom metal layer may be a first conductive layer of the conductive layers provided on the substrate SUB. Although not directly illustrated in the drawings, the bottom metal layer may be electrically connected to the first transistor T1 and thus increase a driving range of a predetermined voltage to be supplied to the gate electrode GE of the first transistor T1. For example, the bottom metal layer may be electrically and/or physically connected with one of the first and second terminals TE1 and TE2 of the first transistor T1.

The pixel circuit layer PCL may include a power line provided and/or formed on the interlayer insulating layer ILD. For example, the power line may include a second power line PL2. The second power line PL2 and the first and second terminals TE1 and TE2 of the transistors T may be provided on the same layer. A voltage of the second driving power supply VSS may be applied to the second power line PL2. Although not directly illustrated, the pixel circuit layer PCL may further include a first power line PL1. The first power line PL1 and the second power line PL2 may be provided on the same layer or different layers. Although in the foregoing embodiment the second power line PL2 has been described as being provided and/or formed on the interlayer insulating layer ILD, the disclosure is not limited thereto. In an embodiment, the second power line PL2 and any of the conductive layers provided on the pixel circuit layer PCL may be provided on the same layer. In other words, the location of the second power line PL2 in the pixel circuit layer PCL may be changed in various suitable ways.

Each of the first power line PL1 and the second power line PL2 may include a conductive material. For example, each of the first power line PL1 and the second power line PL2 may have a single-layer structure formed of at least one selected from the group consisting of copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag) to reduce line resistance. For instance, each of the first power line PL1 and the second power line PL2 may have a double-layer structure formed by stacking layers in a sequence of titanium (Ti) and copper (Cu).

The first power line PL1 may be electrically connected with some components of the display element layer DPL. The second power line PL2 may be electrically connected with other components of the display element layer DPL.

The passivation layer PSV may be provided and/or formed on the transistors T and the second power line PL2.

The passivation layer PSV (referred also to as "protective layer" or "via layer") may be an inorganic layer (an inorganic insulating layer) including an inorganic material, or an organic layer (or an organic insulating layer) including an organic material. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). The organic insulating layer may include, for example, at least one of poly-acrylates resin, epoxy resin, phenolic resin, polyamides resin, polyimides rein, unsaturated polyesters resin, poly-phenylene ethers resin, poly-phenylene sulfides resin, and benzocyclobutene resin.

In an embodiment, the passivation layer PSV and the interlayer insulating layer ILD may have a same material, but the disclosure is not limited thereto. The passivation layer PSV may be provided in a single-layer structure or a multi-layer structure having at least two or more layers. The passivation layer PSV may include a first contact portion CNT1 which exposes the first terminal TE1 of the first transistor T1, and a second contact portion CNT2 which exposes a portion of the second power line PL2.

The display element layer DPL may be provided and/or formed on the passivation layer PSV.

The display element layer DPL may include bank patterns BNP, connection electrodes BRE, alignment electrodes ALE, a bank BNK, light emitting elements LD, pixel electrodes ELT, and intermediate electrodes CTE. Furthermore, the display element layer DPL may include at least one or more insulating layers disposed between the foregoing components. For example, the display element layer DPL may include a first insulating layer INS1, a second insulating layer INS2, a third insulating layer INS3, and a fourth insulating layer INS4. In an embodiment, the third insulating layer INS3 may be selectively provided.

The bank patterns BNP may be disposed on a surface of the pixel circuit layer PCL. For example, the bank patterns BNP may be provided on a surface of the passivation layer PSV. The bank patterns BNP may protrude in the third direction DR3 on the surface of the passivation layer PSV. Hence, areas of the connection electrode BRE and the alignment electrode ALE that are disposed on the bank patterns BNP may protrude in the third direction DR3.

The bank patterns BNP may be an inorganic insulating layer including an inorganic material or an organic insulating layer including an organic material. In an embodiment, the bank patterns BNP may include an organic insulating layer having a single-layer structure and/or an inorganic insulating layer having a single-layer structure, but the disclosure is not limited thereto. In an embodiment, the bank patterns BNP may be provided in a multi-layer structure formed by stacking at least one organic insulating layer and at least one inorganic insulating layer. However, the material of the bank patterns BNP is not limited to the foregoing embodiment. In an embodiment, the bank patterns BNP may include a conductive material (or conductive substance).

The bank patterns BNP may have a trapezoidal cross-section, a width of which reduces from a surface (e.g., an upper surface) of the passivation layer PSV upward in the third direction DR3, but the disclosure is not limited thereto. In an embodiment, the bank patterns BNP may include a curved surface having a cross-sectional shape such as a semi-elliptical shape or a semi-circular shape (or a hemi-spherical shape), a width of which reduces from a surface of the passivation layer PSV upward in the third direction DR3. In a sectional view, the shape of the bank patterns BNP is not limited to the foregoing examples, and may be changed in various suitable ways as long as the efficiency of light emitted from each of the light emitting elements LD may be enhanced. Furthermore, in some embodiments, at least one of the bank patterns BNP may be omitted, or the position thereof may be changed.

In an embodiment, the bank patterns BNP each may be used as a reflector. For example, the bank patterns BNP, along with the alignment electrodes ALE provided thereover, may be used as reflectors to guide light emitted from each light emitting element LD in a desired direction, so that the light output efficiency of the pixel PXL may be enhanced.

The connection electrodes BRE may be provided on the bank patterns BNP. For example, the first connection electrode BRE1 may be provided on the first bank pattern BNP1 and have a shape corresponding to an inclination of the first bank pattern BNP1. The third connection electrode BRE3 may be provided on a first side of the second bank pattern BNP2 and have a shape corresponding to an inclination of the first side of the second bank pattern BNP2. The second connection electrode BRE2 may be provided on a second side of the second bank pattern BNP2 and have a shape corresponding to an inclination of the second side of the second bank pattern BNP2. The fourth connection electrode BRE4 may be provided on the third bank pattern BNP3 and have a shape corresponding to an inclination of the third bank pattern BNP3.

The connection electrodes BRE may have an identical thickness in the third direction DR3 and be simultaneously formed by an identical process.

The connection electrodes BRE may be formed of a conductive material (or conductive substance). For example, the connection electrodes BRE may include a transparent conductive material. The transparent conductive material (or substance) may include transparent conductive oxides such as indium tin oxide (ITO), indium zinc oxide (IZO), zinc oxide (ZnO), indium gallium zinc oxide (IGZO), and indium tin zinc oxide (ITZO), and a conductive polymer such as poly(3,4-ethylenedioxythiophene) (PEDOT). However, the material of the connection electrodes BRE is not limited to the foregoing materials.

The first connection electrode BRE1 may be electrically connected with the first transistor T1 through the first contact portion CNT1. The second connection electrode BRE2 may be electrically connected with the second power line PL2 through the second contact portion CNT2.

The alignment electrode ALE may be provided and/or formed on the connection electrodes BRE. For example, the first alignment electrode ALE1 (or the first upper electrode) may be directly formed on the first connection electrode BRE1 (or the first lower electrode) so that the first connection electrode BRE1 and the first alignment electrode ALE1 may be electrically connected with each other (or contact each other). The second alignment electrode ALE2 (or the second upper electrode) may be directly formed on the second connection electrode BRE2 (or the second lower electrode) so that the second connection electrode BRE2 and the second alignment electrode ALE2 may be electrically connected with each other (or contact each other). The third alignment electrode ALE3 (or the third upper electrode) may be directly formed on the third connection electrode BRE3 (or the third lower electrode) so that the third connection electrode BRE3 and the third alignment electrode ALE3 may be electrically connected with each other (or contact each other). The fourth alignment electrode ALE4 (or the fourth upper electrode) may be directly formed on the fourth connection electrode BRE4 (or the fourth lower electrode) so that the fourth connection electrode BRE4 and the fourth alignment electrode ALE4 may be electrically connected with each other (or contact each other).

The first alignment electrode ALE1 may have a shape corresponding to an inclination of the first connection electrode BRE1 disposed thereunder. The second alignment electrode ALE2 may have a shape corresponding to an inclination of the second connection electrode BRE2 disposed thereunder. The third alignment electrode ALE3 may have a shape corresponding to an inclination of the third connection electrode BRE3 disposed thereunder. The fourth alignment electrode ALE4 may have a shape corresponding to an inclination of the fourth connection electrode BRE4 disposed thereunder.

The alignment electrodes ALE may be disposed on an identical plane and have an identical thickness in the third direction DR3. Furthermore, the alignment electrodes ALE may be simultaneously formed by an identical process.

The alignment electrodes ALE may be formed of material having a constant (or uniform) reflectivity to allow light emitted from the light emitting elements LD to travel in an image display direction of the display device. For example, the alignment electrodes ALE may be formed of a conductive material. The conductive material may include an opaque metal that has an advantage in reflecting, in the image display direction of the display device, light emitted by the light emitting elements LD. For example, the opaque metal may include metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the material of the alignment electrodes ALE is not limited to the foregoing embodiment.

The alignment electrodes ALE and the connection electrodes BRE may be formed of different materials. For example, the alignment electrodes ALE may be formed of a conductive material having a sidewall etching rate higher than that of the connection electrodes BRE during a wet etching process. Furthermore, the alignment electrodes ALE may be formed of material having an electrical conductivity higher than (e.g., material having a resistivity lower than) that of the connection electrodes BRE. As described above, in case that the alignment electrodes ALE is formed of a conductive material having a high sidewall etching rate, the sidewall of each of the alignment electrodes ALE may be excessively etched during a wet etching process. In this case, as illustrated in FIG. 12, a distance between the alignment electrodes ALE adjacent to each other in the first direction DR1 in the emission area EMA becomes more than a distance between the adjacent connection electrodes BRE disposed thereunder, so that the alignment electrodes ALE and the connection electrodes BRE that directly contact each other may have different planar shapes (or different shaped in a plan view).

Each of the alignment electrodes ALE may be provided and/or formed to have a single-layer structure, but the disclosure is not limited thereto. In an embodiment, each of the alignment electrodes ALE may be provided and/or formed in a multi-layer structure formed by stacking at least two materials among metals, alloys, conductive oxides, and conductive polymers. Each of the alignment electrodes ALE may be formed of a multi-layer structure including at least two layers to minimize distortion resulting from a signal delay in case that signals (or voltages) are transmitted to the opposite ends EP1 and EP2 of the respective light emitting elements LD. For example, each of the alignment electrodes ALE may include at least one reflective electrode layer. Furthermore, each of the alignment electrodes ALE may selectively further include at least one of at least one transparent electrode layer disposed over and/or under the reflective electrode layer, and at least one conductive capping layer covering an upper portion of the reflective electrode layer and/or the transparent electrode layer.

As described above, in case that the alignment electrodes ALE are formed of a conductive material having a constant reflectivity, light emitted from the opposite ends, e.g., the first and second ends EP1 and EP2, of each of the light emitting elements LD may more reliably travel in the image display direction (or the third direction DR3) of the display device. For example, if the alignment electrodes ALE have inclined or curved surfaces corresponding to the shape of the connection electrodes BRE and are disposed to face the first and second ends EP1 and EP2 of the light emitting elements LD, light emitted from the first and second ends EP1 and EP2 of each of the light emitting elements LD may be reflected by the alignment electrodes ALE and thus more reliably travel in the image display direction of the display device. Consequently, the efficiency of light emitted from the light emitting elements LD may be enhanced.

The first insulating layer INS1 may be provided and/or formed on the alignment electrodes ALE. For example, the first insulating layer INS1 may be provided and/or formed on the alignment electrodes ALE to completely cover the alignment electrodes ALE. Furthermore, the first insulating layer INS1 may be partially open to expose an area of each of the first and second connection electrodes BRE1 and BRE2 in the emission area NEMA.

The first insulating layer INS1 may be formed of an inorganic insulating layer including an inorganic material, or an organic insulating layer including an organic material. The first insulating layer INS1 may be formed of an inorganic insulating layer having an advantage in protecting the light emitting elements LD from the pixel circuit layer PCL. For example, the first insulating layer INS1 may include at least one of silicon nitride ($SiN_x$), silicon oxide ($SiO_x$), silicon oxynitride ($SiO_xN_y$), and metal oxide such as aluminum oxide ($AlO_x$), but the disclosure is not limited thereto. In an embodiment, the first insulating layer INS1 may be formed of an organic insulating layer that has an advantage in planarization of support surfaces of the light emitting elements LD.

The first insulating layer INS1 may be provided to have a single-layer or multi-layer structure. In case that the first insulating layer INS1 is formed of multiple layers, the first insulating layer INS1 may have a distributed Bragg reflector (DBR) structure formed by alternately stacking first layers and second layers which are formed of inorganic insulating layers and have different refractive indexes. For example, the first insulating layer INS1 may have a stacked structure formed by alternately stacking the first layers having a low refractive index and the second layers having a refractive index greater than that of the first layers. As described above, in case that the first insulating layer INS1 is formed of multiple layers, the first insulating layer INS1 may be used as a reflector configured to reflect light emitted from the light emitting elements LD in a target direction by using constructive interference due to a difference in refractive index between the first layers and the second layers. Each of the first and second layers may include at least one of silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), silicon oxycarbide ($SiO_xC_y$), aluminum oxide ($AlO_x$), aluminum nitride ($AlN_x$), hafnium oxide ($HfO_x$), zirconium oxide ($ZrO_x$), titanium oxide ($TiO_x$), and tantalum oxide ($TaO_x$).

The bank BNK may be provided and/or formed on the first insulating layer INS1.

The bank BNK may be formed, to enclose the emission area EMA of the pixel SPX, between other pixels PXL so that a pixel defining layer for defining the emission area EMA of the corresponding pixel SPX may be formed. At the step of supplying the light emitting elements LD to the emission area EMA, the bank BNK may be a dam structure configured to prevent a solution mixed with the light emitting elements LD from being introduced into the emission area EMA of an adjacent pixel PXL or control the amount of solution such that a constant amount of solution is supplied to each emission area EMA.

The light emitting elements LD may be supplied to and aligned in the emission area EMA of the pixel PXL in which the first insulating layer INS1 is formed. For example, the light emitting elements LD may be supplied (or input) to the emission area EMA by an inkjet printing method. The light emitting elements LD may be aligned between the alignment electrodes ALE by an alignment signal (or an alignment voltage) applied to each of the alignment electrodes ALE.

In the emission area EMA, the second insulating layer INS2 may be provided and/or formed on the light emitting elements LD. The second insulating layer INS2 may be provided and/or formed on the light emitting elements LD to partially cover the outer circumferential surface (or the surface) of each of the light emitting elements LD such that the first end EP1 and the second end EP2 of each of the light emitting element LD are exposed to the outside.

The second insulating layer INS2 may be formed of a single layer or multiple layers and include an inorganic insulating layer including at least one inorganic material or an organic insulating layer including at least one organic material. The second insulating layer INS2 may include an inorganic insulating layer that has an advantage in protecting the active layer 12 (see FIG. 1) of each of the light emitting elements LD from external oxygen, water, etc. However, the disclosure is not limited thereto. The second insulating layer INS2 may be formed of an organic insulating layer including an organic material, depending on design conditions, etc. of the display device to which the light emitting elements LD are applied. Since the second insulating layer INS2 is formed on the light emitting elements LD after the alignment of the light emitting elements LD in the pixel area PXA (or the emission area EMA) of the pixel PXL has been completed, the light emitting elements LD may be prevented from being removed from the aligned positions.

In case that a gap (or space) is present between the first insulating layer INS1 and the light emitting elements LD before the formation of the second insulating layer INS2, the gap may be filled with the second insulating layer INS2 during a process of forming the second insulating layer INS2. In this case, the second insulating layer INS2 may be formed of an organic insulating layer that has an advantage in filling the gap between the first insulating layer INS1 and the light emitting elements LD.

In the non-emission area NEMA, the second insulating layer INS2 may include a first contact hole CH1 and a second contact hole CH2 which are formed in the second opening OP2. In other words, the second insulating layer INS2 may be formed to include, in the second opening OP2, the first contact hole CH1 formed by removing an area thereof and the second contact hole CH2 formed by removing another area thereof. The second insulating layer INS2 including the first contact hole CH1 and the second contact hole CH2 will be described below with reference to FIGS. 14 to 16.

The third insulating layer INS3 may be disposed to cover (or overlap) at least one of the pixel electrodes ELT and at least one of the intermediate electrodes CTE that are disposed on the first and second ends EP1 and EP2 of the light emitting elements LD. If the second and/or third insulating layers INS2 and/or INS3 are formed over the light emitting elements LD, electrical stability between the first and second ends EP1 and EP2 of the light emitting elements LD may be secured. For example, the pixel electrode ELT and the intermediate electrode CTE that are adjacent to each other may be reliably separated from each other by the second and/or third insulating layers INS2 and/or INS3. Hence, a short-circuit defect between the first and second ends EP1 and EP2 of the light emitting elements LD may be prevented from occurring.

As illustrated in FIG. 9, in an embodiment where the pixel electrodes ELT and the intermediate electrodes CTE are disposed on an identical layer, the third insulating layer INS3 may not be provided.

The pixel electrodes ELT may be provided on the second insulating layer INS2 and formed of various suitable transparent conductive materials. For example, the pixel electrodes ELT may include at least one of various suitable transparent conductive materials (or substances) including indium tin oxide (ITO), indium zinc oxide (IZO), zinc oxide (ZnO), indium gallium zinc oxide (IGZO), and indium tin zinc oxide (ITZO), and be substantially transparent or translucent to satisfy a predetermined transmittancy (or transmittance). However, the material of the pixel electrodes ELT is not limited to the foregoing embodiment. In an embodiment, the pixel electrodes ELT may be formed of various suitable opaque conductive materials (or substances). The pixel electrodes ELT may be formed of a single layer or multiple layers. In an embodiment, the pixel electrodes ELT and the connection electrode BRE may include a same material.

The first pixel electrode ELT1 and the second pixel electrode ELT2 may be formed by an identical process and be provided on an identical layer. However, the disclosure is not limited thereto. In some embodiments, the first pixel electrode ELT1 and the second pixel electrode ELT2 may be formed by different processes and be provided on different layers.

At least one of the intermediate electrodes CTE, and the pixel electrodes ELT may be formed by a same process and be formed on a same layer. The other intermediate electrodes CTE and the pixel electrodes ELT may be formed by different processes and be formed on different layers. For example, the first and third intermediate electrodes CTE1 and CTE3 may be formed on the third insulating layer INS3 and be spaced apart from the pixel electrodes ELT covered (or overlapped) with the third insulating layer INS3. Furthermore, the second intermediate electrode CTE2 and the pixel electrodes ELT may be formed by a same process and be provided on a same layer. The disclosure is not limited to the foregoing embodiments. In an embodiment, the first, second, and third intermediate electrodes CTE1, CTE2, and CTE3 and the pixel electrodes ELT may be formed by a same process and be provided on a same layer.

The intermediate electrodes CTE may be formed of various suitable transparent conductive materials. The intermediate electrodes CTE and the pixel electrodes ELT may include a same material, or the intermediate electrodes CTE may include one or more materials selected from among materials that may form the pixel electrodes ELT.

The fourth insulating layer INS4 may be provided and/or formed on the intermediate electrodes CTE. The fourth insulating layer INS4 may be an inorganic insulating layer including an inorganic material or an organic insulating layer including an organic material. For example, the fourth insulating layer INS4 may have a structure formed by alternately stacking at least one inorganic insulating layer and at least one organic insulating layer. The fourth insulating layer INS4 may cover the entirety of the display element layer DPL and prevent water or moisture from being introduced into the display element layer DPL including the light emitting elements LD from the outside. In an embodiment, at least one overcoat layer (e.g., a layer for planarizing the upper surface of the display element layer DPL) may be further disposed over the fourth insulating layer INS4.

In an embodiment, as illustrated in FIG. 10, an upper substrate may be further disposed on the fourth insulating layer INS4. The upper substrate may be provided on the display element layer DPL to cover the display area DA of the substrate SUB on which the pixel PXL is disposed. An intermediate layer CTL may be provided on the display element layer DPL.

The intermediate layer CTL may be a transparent adhesive layer (or a transparent bonding layer), e.g., an optically clear adhesive layer, for enhancing the adhesive force between the display element layer DPL and the upper substrate, but the disclosure is not limited thereto. In an embodiment, the intermediate layer CTL may be a refractive index conversion layer configured to change the refractive index of light emitted from the light emitting elements LD toward the upper substrate and enhance the emission luminance of each pixel PXL.

The upper substrate may be formed of an encapsulation substrate (or a thin-film encapsulation layer) and/or a window layer of the display device. The upper substrate may include a base layer BSL and a light conversion pattern layer LCP.

The base layer BSL may be a rigid or flexible substrate, and the material or properties thereof are not particularly limited. The base layer BSL and the substrate SUB may be formed of the same material, or may be formed of different materials.

The light conversion pattern layer LCP may be disposed on a surface of the base layer BSL to face the pixels PXL of the substrate SUB. The light conversion pattern layer LCP may include a color conversion layer CCL and a color filter CF.

The color conversion layer CCL may include color conversion particles QD corresponding to a specific color. The color filter CF may allow light having the specific color to selectively pass therethrough.

The color conversion layer CCL may be disposed on a surface of the base layer BSL to face the corresponding pixel PXL, and include color conversion particles QD which convert a first color of light emitted from the light emitting elements LD disposed in the corresponding pixel to a second color of light. For example, in case that the pixel PXL is a red pixel (or a red sub-pixel), the color conversion layer CCL may include color conversion particles QD formed of red quantum dots which convert a first color of light emitted from the light emitting elements LD to a second color of light, e.g., red light. For example, in case that the pixel PXL is a green pixel (or a green sub-pixel), the color conversion layer CCL of the corresponding pixel PXL may include color conversion particles QD formed of green quantum dots which convert a first color of light emitted from the light emitting elements LD to a second color of light, e.g., green light. For example, in case that the pixel PXL is a blue pixel (or a blue sub-pixel), the color conversion layer CCL of the corresponding pixel PXL may include color conversion particles QD formed of blue quantum dots which convert a first color of light emitted from the light emitting elements LD to a second color of light, e.g., blue light. In an embodiment, in case that the pixel PXL is a blue pixel (or a blue sub-pixel), there may be provided a light scattering layer having light scattering particles, in place of the color conversion layer CCL having the color conversion particles QD. For example, in case that the light emitting elements LD emit blue-based light, the pixel PXL may include a light scattering layer including light scattering particles. The light scattering layer may be omitted depending on embodiments. In an embodiment, in case that the pixel PXL is a blue pixel (or a blue sub-pixel), there may be provided a transparent polymer, in place of the color conversion layer CCL.

The color filter CF may allow a specific color of light to selectively pass therethrough. The color filter CF along with the color conversion layer CCL may form the light conversion pattern layer LCP and include color filter material which allows a specific color of light converted by the color conversion layer CCL to selectively pass therethrough. The color filter CF may include a red color filter, a green color filter, and a blue color filter. The color filter CF may be provided in the pixel area PXA of the pixel PXL to correspond to the color conversion layer CCL.

The light conversion pattern layer LCP including the color conversion layer CCL and the color filter CF may correspond to the emission area EMA of the pixel PXL.

A first light block pattern LBP1 may be disposed between the color filters CF of adjacent pixels PXL. The first light block pattern LBP1 may be provided on a surface of the base layer BSL to overlap the bank BNK provided in the pixel area PXA of the pixel PXL.

In an embodiment, the first light block pattern LBP1 may be provided in the form of a multi-layer structure formed by overlapping at least two color filters allowing different colors of light to selectively pass therethrough, among a red color filter, a green color filter, and a blue color filter. For example, the first light block pattern LBP1 may be provided in the form of a structure including a red color filter, a green color filter disposed on the red color filter and overlapping the red color filter, and a blue color filter disposed on the green color filter and overlapping the green color filter. In other words, the first light block pattern LBP1 may be provided in the form of a structure formed by successively stacking the red color filter, the green color filter, and the blue color filter. In this case, in the non-emission area NEMA of the pixel area PXA, the red color filter, the green color filter, and the blue color filter may be used as the first light block pattern LBP1 for blocking transmission of light.

In an embodiment, a second light block pattern LBP2 may be disposed on the first light block pattern LBP1. The first light block pattern LBP1 and the second light block pattern LBP2 may include an identical material. The first light block pattern LBP1 and the second light block pattern LBP2 each may be formed of a black matrix.

Although in the foregoing embodiment there has been described that the upper substrate including the base layer BSL and the light conversion pattern layer LCP is provided over the pixel PXL, the disclosure is not limited thereto.

In an embodiment, the light conversion pattern layer LCP may be formed on a surface of the substrate SUB on which the pixel PXL is provided.

In an embodiment, as illustrated in FIG. 11, some components, e.g. the color conversion layer CCL, of the light conversion pattern layer LCP may be formed on the surface of the substrate SUB on which the pixel PXL is provided, and another component (or the other components), e.g., the color filter CF, of the light conversion pattern layer LCP may be provided to face the color conversion layer CCL with the intermediate layer CTL interposed therebetween. In this case, a dummy bank DBNK may be provided and/or formed on the bank BNK. The dummy bank DBNK may be disposed on the bank BNK and embody a dam DAM along with the bank BNK. The dam DAM may be a structure which ultimately defines, in the pixel PXL, the emission area EMA from which light is to be emitted. In an embodiment, during a process of supplying a color conversion layer CCL including color conversion particles QD to the emission area PXA, the dam DAM may be a structure which ultimately defines the emission area EMA to which the color conversion layer CCL is to be supplied. For example, since the emission area EMA of the pixel PXL is ultimately defined by the dam DAM, the color conversion layer CCL including a target amount and/or type (or kind) of light conversion particles QD may be supplied (or input) to the emission area EMA.

The dummy bank DBNK may be provided and/or formed on the fourth insulating layer INS4. The dummy bank DBNK may include light block material. For example, the dummy bank DBNK may be a black matrix. In an embodiment, the dummy bank DBNK may include at least one light block material and/or at least one reflective material, and allow light emitted from the light emitting elements LD to more reliably travel in the image display direction (or the third direction DR3) of the display device, thus enhancing the light output efficiency of the light emitting elements LD.

Figure 14:
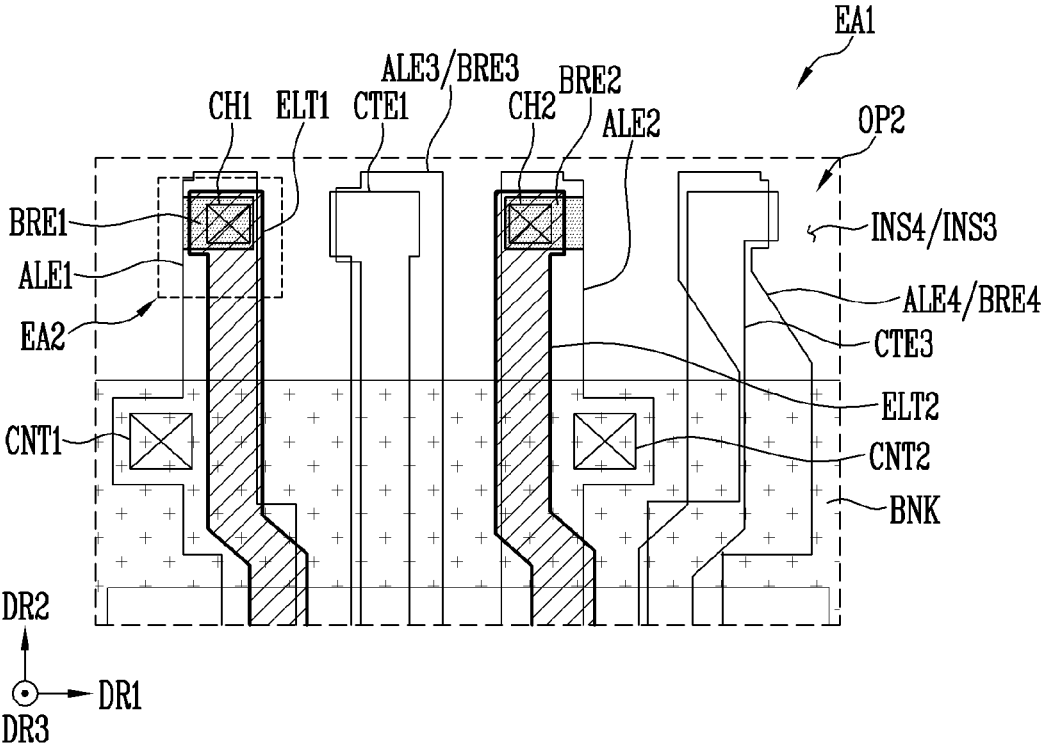
FIG. 14 is a schematic enlarged view of portion EA1 of FIG. 7.
Figure 15:
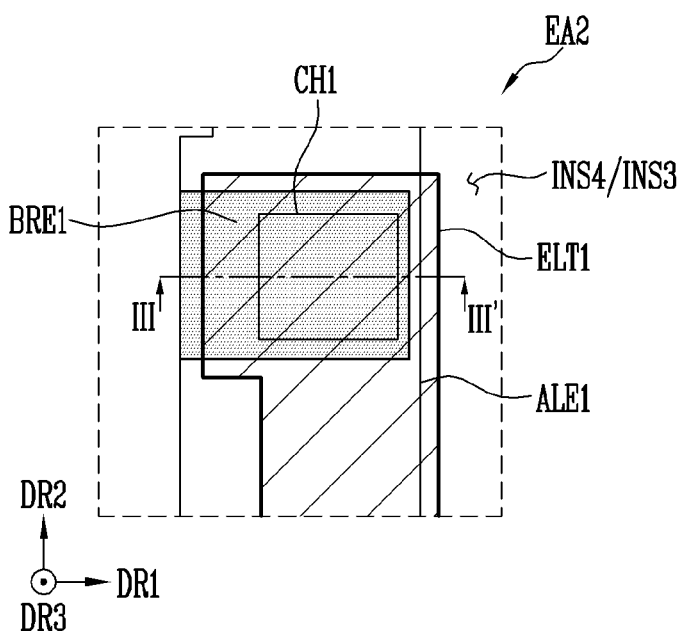
FIG. 15 is a schematic enlarged view of portion EA2 of FIG. 14.
Figure 16:
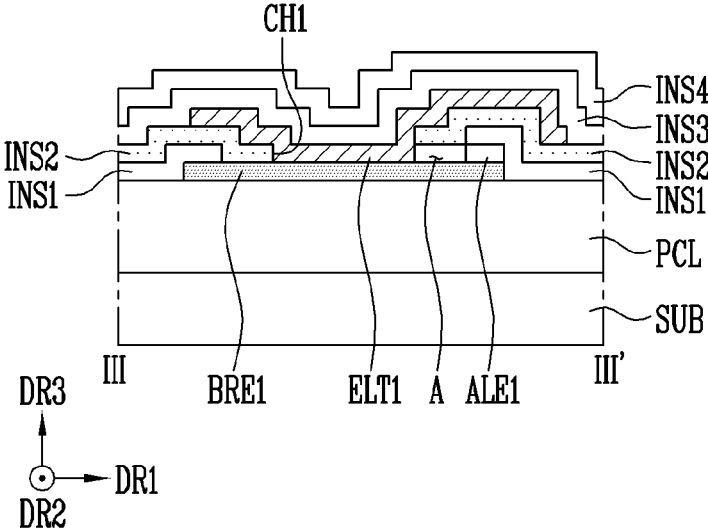
FIG. 16 is a schematic cross-sectional view taken along line III-III' of FIG. 15.

FIG. 14 is a schematic enlarged view of portion EA1 of FIG. 7. FIG. 15 is a schematic enlarged view of portion EA2 of FIG. 14. FIG. 16 is a cross-sectional view taken along line III-III' of FIG. 15.

Referring to FIGS. 5 to 16, in the second opening OP2 (or the electrode separation area) of the bank BNK, the first pixel electrode ELT1 may directly contact the first connection electrode BRE1 exposed through the first contact hole CH1. Furthermore, the second pixel electrode ELT2 in the second opening OP2 may directly contact the second connection electrode BRE2 exposed through the second contact hole CH2.

The first and second contact holes CH1 and CH2 each may be an opening formed by removing an area of the second insulating layer INS2 to expose components disposed thereunder to the outside. In the second opening OP2, the first contact hole CH1 may be formed, to expose one area of the first connection electrode BRE1, by removing an area of the second insulating layer INS2 that corresponds to the one area of the first connection electrode BRE1. In the second opening OP2, the second contact hole CH2 may be formed, to expose an area of the second connection electrode BRE2, by removing one area of the second insulating layer INS2 that corresponds to the one area of the second connection electrode BRE2.

A portion of the first alignment electrode ALE1 on the first connection electrode BRE1 that corresponds to the first contact hole CH1 may be removed by a primary etching process after a second conductive layer (e.g., the second conductive layer is formed of base material for forming the alignment electrode ALE) including the first alignment electrode ALE1 is applied to a first conductive layer (e.g., the first conductive layer is formed of base material for forming the connection electrode BRE) including the first connection electrode BRE1. Hence, the first connection electrode BRE1 disposed under the first alignment electrode ALE1 may be exposed to the outside. During a process of forming the second insulating layer INS2, the first connection electrode BRE1 and the first alignment electrode ALE1 the portion of which is removed may be exposed to the outside. During an electrode separation process (e.g., a process for independently (or individually) each pixel PXL) that is thereafter performed, the portion of the first alignment electrode ALE1 that is exposed to the outside may be removed so that the first connection electrode BRE1 may be completely exposed through the first contact hole CH1 of the second insulating layer INS2. In an area of the pixel area PXA that corresponds to the first contact hole CH1 of the second insulating layer INS2, the first alignment electrode ALE1 may be removed, and the first connection electrode BRE1 disposed thereunder may be completely exposed.

The first pixel electrode ELT1 may be provided on the second insulating layer INS2 and be electrically connected to the first connection electrode BRE1 exposed through the first contact hole CH1. In other words, the first pixel electrode ELT1 may directly contact the first connection electrode BRE1 exposed through the first contact hole CH1. Hence, the first pixel electrode ELT1 may be electrically and/or physically connected with the first connection electrode BRE1 and thus electrically connected with the first alignment electrode ALE1 and some components of the pixel circuit PXC, e.g., the first transistor T1 and the first power line PL1 of the pixel circuit PXC, through the first connection electrode BRE1. In an embodiment, the first pixel electrode ELT1 may be formed, by a chemical vapor deposition (CVD) method, on the first connection electrode BRE1 from which the first alignment electrode ALE1 is removed to directly contact the first connection electrode BRE1. The first pixel electrode ELT1 may be formed on the first connection electrode BRE1 to have a profile corresponding to a shape of the second insulating layer INS2. In this case, a space A (or a skew) is formed between a sidewall of the first alignment electrode ALE1 and a sidewall of the first pixel electrode ELT1. The space A may be formed in such a way that, since the sidewall of the first alignment electrode ALE1 that is exposed to the outside is excessively etched during the above-mentioned electrode separation process, the first alignment electrode ALE1 is disposed inside than the second insulating layer INS2, and thus the space A is enclosed by the second insulating layer INS2, the first alignment electrode ALE1, and the first pixel electrode ELT1 during a process of forming the first pixel electrode ELT1. Even if the space A is formed between the first pixel electrode ELT1 and the first alignment electrode ALE1, the first pixel electrode ELT1 may directly contact the first connection electrode BRE1 exposed by the first contact hole CH1 and be electrically connected with the first alignment electrode ALE1 through the first connection electrode BRE1.

Similarly, a portion of the second alignment electrode ALE2 on the second connection electrode BRE2 that corresponds to the second contact hole CH2 may be removed by a primary etching process after the second conductive layer including the second alignment electrode ALE2 is applied to the first conductive layer including the second connection electrode BRE2. Hence, the second connection electrode BRE2 disposed under the second alignment electrode ALE2 may be exposed to the outside. During a process of forming the second insulating layer INS2, the second connection electrode BRE2 and the second alignment electrode ALE2 the portion of which is removed may be exposed to the outside. During an electrode separation that is thereafter performed, the portion of the second alignment electrode ALE2 that is exposed to the outside may be removed so that the second connection electrode BRE2 may be completely exposed through the second contact hole CH2 of the second insulating layer INS2. In an area of the pixel area PXA that corresponds to the second contact hole CH2 of the second insulating layer INS2, the second alignment electrode ALE2 may be removed, and the second connection electrode BRE2 disposed thereunder may be completely exposed.

The second pixel electrode ELT2 may be provided on the second insulating layer INS2 and be electrically connected to the second connection electrode BRE2 exposed through the second contact hole CH2. In other words, the second pixel electrode ELT2 may directly contact the second connection electrode BRE2 exposed through the second contact hole CH2. Hence, the second pixel electrode ELT2 may be electrically and/or physically connected with the second connection electrode BRE2 and thus electrically connected with the second alignment electrode ALE2 and some components of the pixel circuit PXC, e.g., the second power line PL2 of the pixel circuit PXC, through the second connection electrode BRE2. During a process of forming the second pixel electrode ELT2, another space enclosed by the second insulating layer INS2, the second alignment electrode ALE2, and the second pixel electrode ELT2 may be formed.

As described above, the alignment electrode ALE may be formed of a conductive material having a high sidewall etching rate in an etching process, e.g., a wet etching process, and be formed of material having a higher electric conductivity than the connection electrode BRE disposed thereunder. Furthermore, since the alignment electrode ALE is disposed on the connection electrode BRE, the time for which the alignment electrode ALE is exposed to the outside while the fabrication process is performed may be greater than that of the connection electrode BRE. In this case, due to material characteristics, the alignment electrode ALE may be oxidized. If the alignment electrode ALE and the pixel electrode ELT are electrically connected to each other by forming the pixel electrode ELT on the oxidized alignment electrode ALE, contact resistance of the pixel electrode ELT may increase. In this case, a delay of a predetermined signal to be applied to the pixel electrode ELT may be caused, so that in case that a predetermined signal (or voltage) is supplied to the light emitting elements LD, a distortion may occur, resulting in a malfunction of the light emitting elements LD.

Given this, in the foregoing embodiment, the alignment electrode ALE may be removed from each of the first and second contact holes CH1 and CH2, which are contact points for electrically connecting the pixel electrode ELT and the alignment electrode ALE, and the connection electrode BRE disposed thereunder may be exposed, so that the pixel electrode ELT and the connection electrode BRE may directly contact each other, whereby the pixel electrode ELT and the alignment electrode ALE may be electrically connected to each other by the connection electrode BRE. Therefore, the contact resistance of the pixel electrode ELT may not be increased, and the reliability of the pixel electrode ELT may be enhanced, so that the light emitting elements LD may be more reliably driven.

A fabrication method of removing an area of the first alignment electrode ALE1 that corresponds to the first contact hole CH1 of the second insulating layer INS2 in the second opening OP2 to expose the first connection electrode BRE1 disposed thereunder, and directly connecting (or contacting) the exposed first connection electrode BRE1 with the first pixel electrode ELT1 will be described in detail with reference to FIGS. 17A to 18H.

FIGS. 17A to 17H are schematic plan views illustrating a method of fabricating the display device in accordance with an embodiment. FIGS. 18A to 18H are schematic cross-sectional views illustrating the method of fabricating the display device in accordance with an embodiment. For example, FIGS. 17A to 17H are schematic plan views for describing the method of fabricating the display device illustrated in FIG. 15. FIGS. 18A to 18H are schematic cross-sectional views for describing the method of fabricating the display device illustrated in FIG. 16. For example, FIG. 18A is a schematic sectional view corresponding to line of FIG. 17A. FIG. 18B is a schematic sectional view corresponding to line III-III' of FIG. 17B. FIG. 18C is a schematic sectional view corresponding to line III-III' of FIG. 17C. FIG. 18D is a schematic sectional view corresponding to line III-III' of FIG. 17D. FIG. 18E is a schematic sectional view corresponding to line III-III' of FIG. 17E.

Figure 17A:
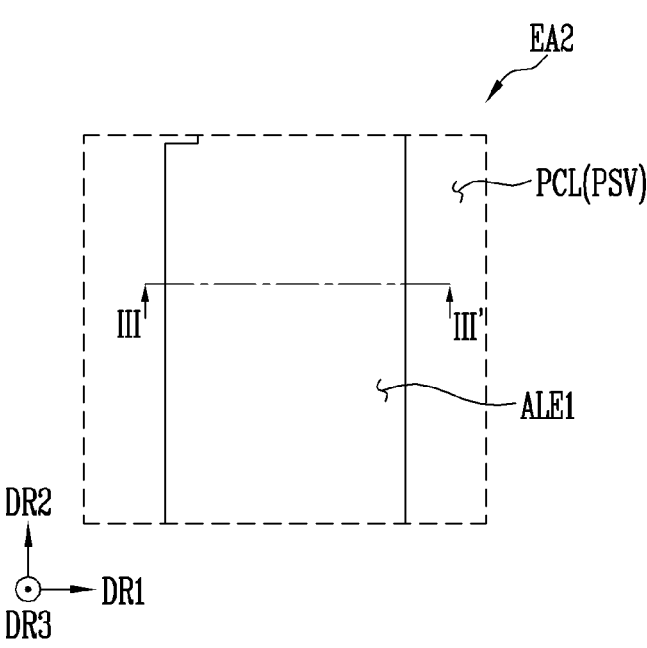
FIGS. 17A to 17H are plan views schematically illustrating a method of fabricating the display device in accordance with an embodiment of the disclosure.
Figure 17B:
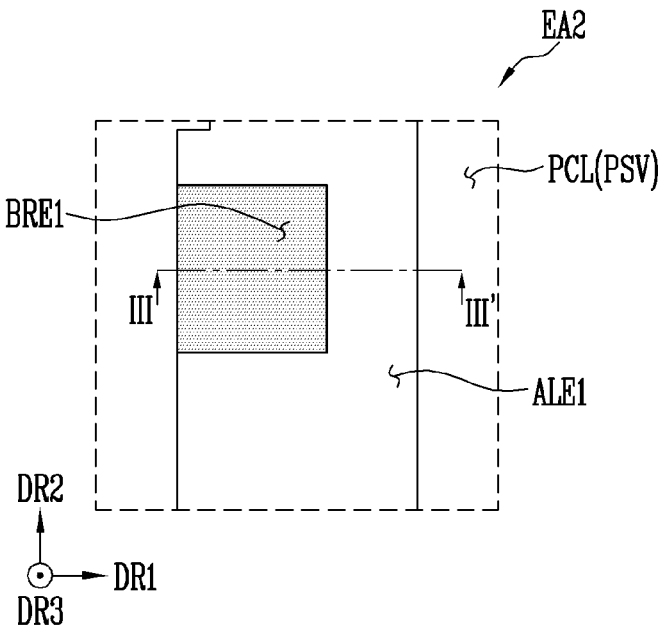
Figure 17C:
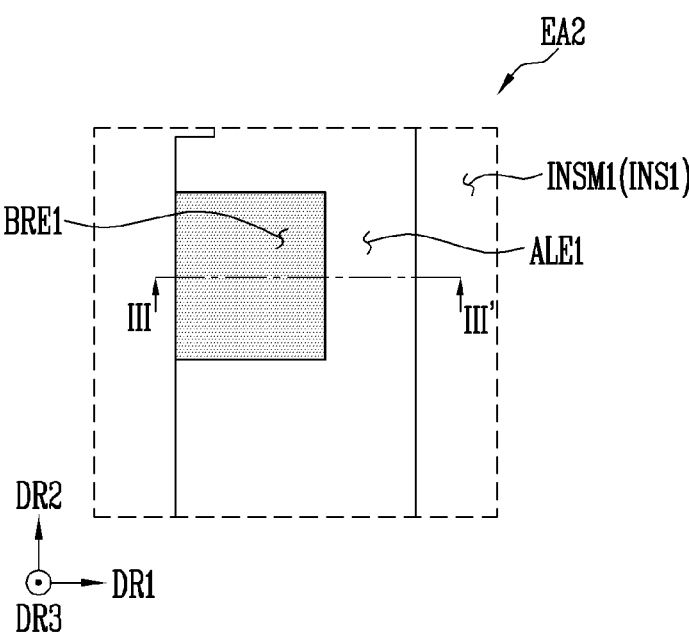
Figure 17D:
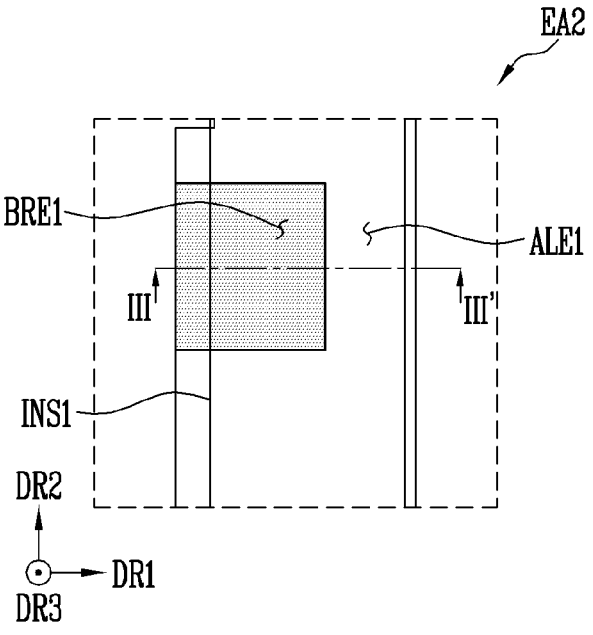
Figure 17E:
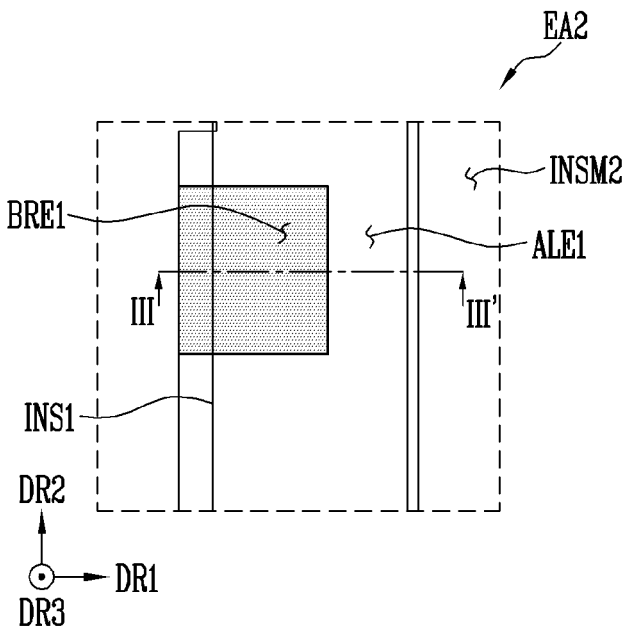
Figure 17F:
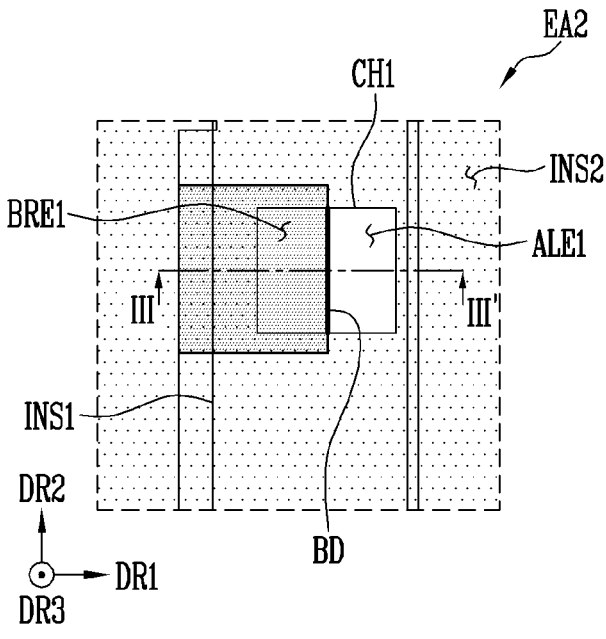
Figure 17G:
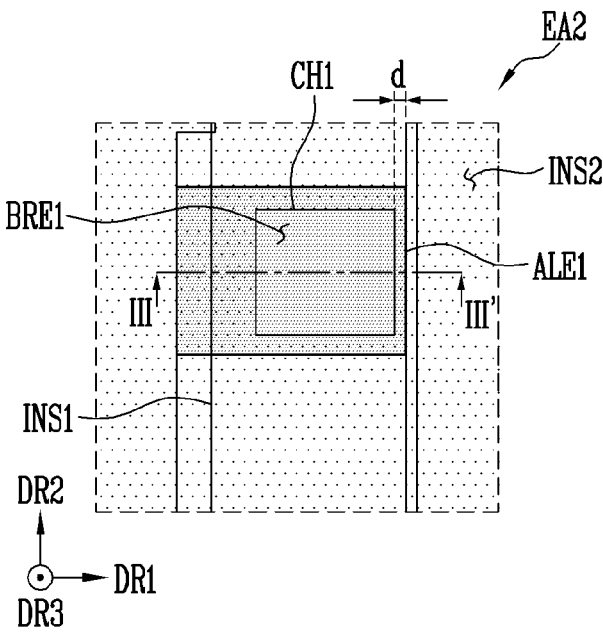
Figure 17H:
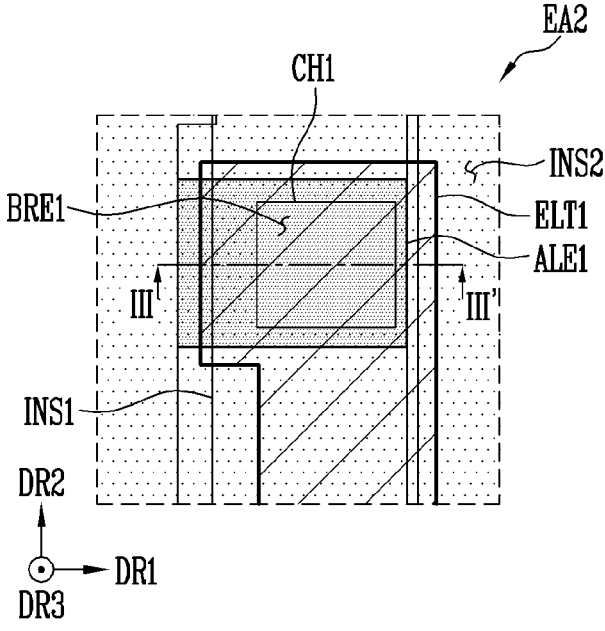
Figure 18A:
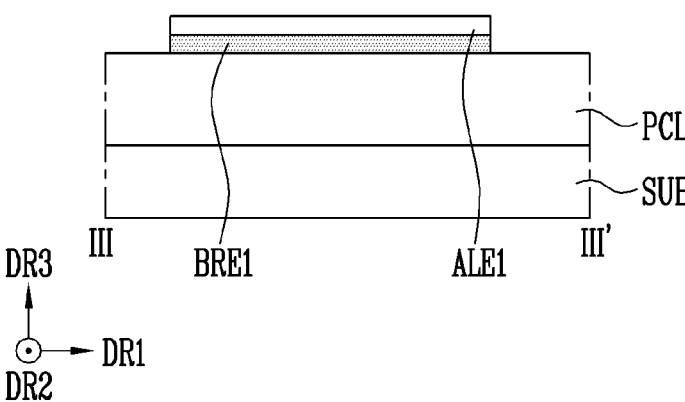
FIGS. 18A to 18H are cross-sectional views schematically illustrating the method of fabricating the display device in accordance with an embodiment of the disclosure.
Figure 18B:
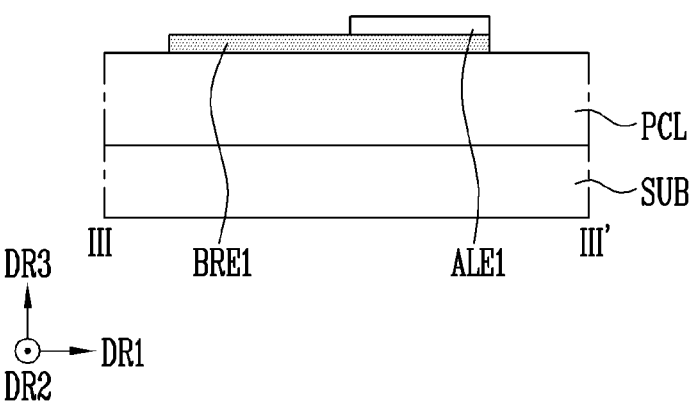
Figure 18C:
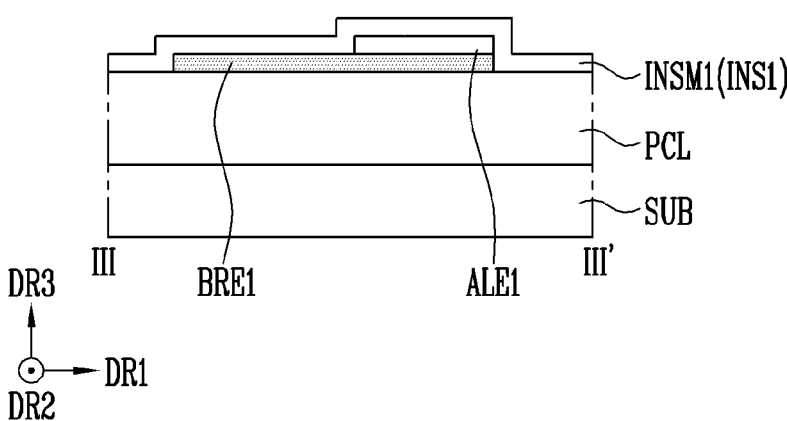
Figure 18D:
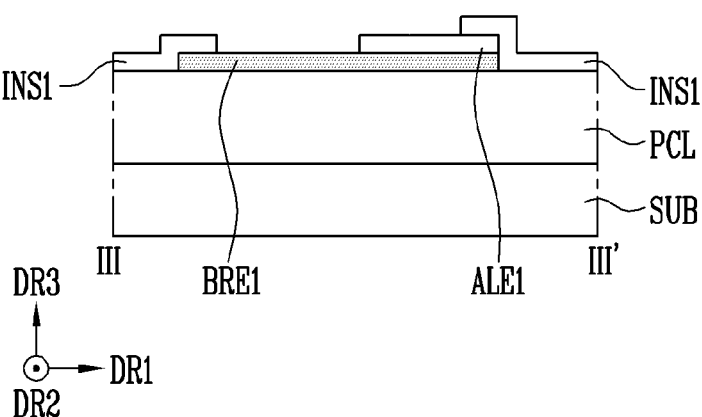
Figure 18E:
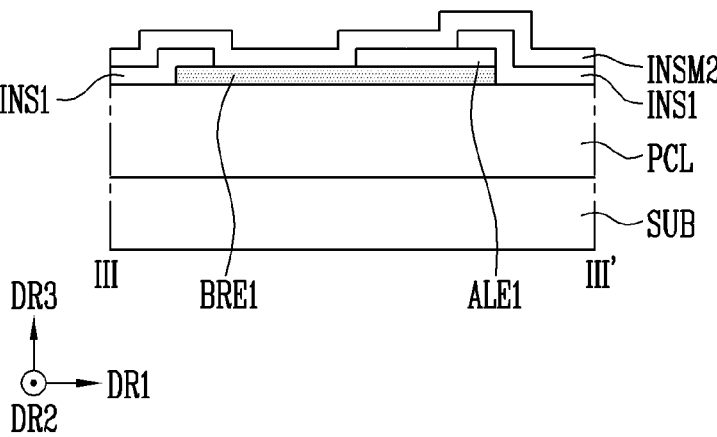
Figure 18F:
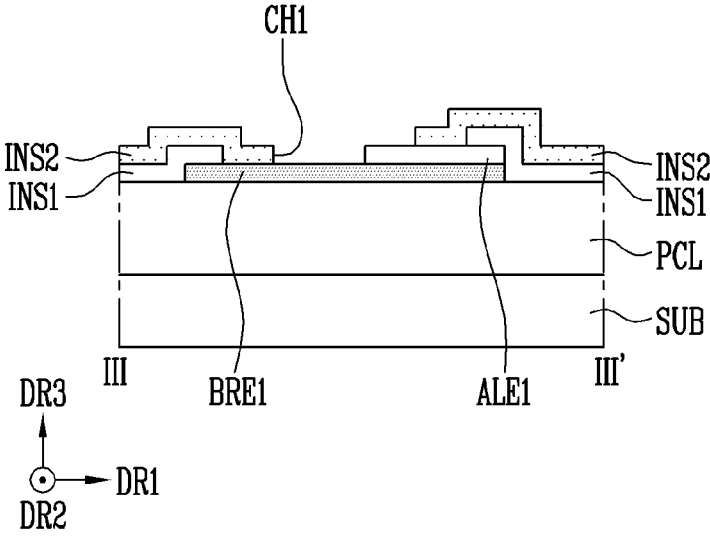
Figure 18G:
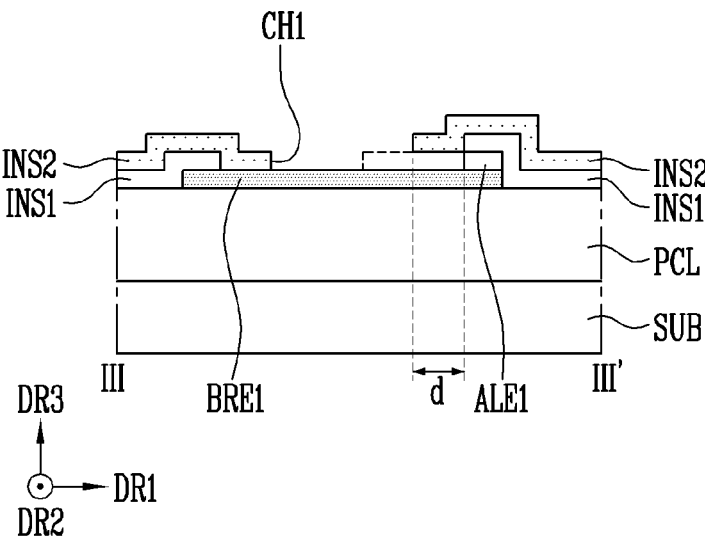
Figure 18H:
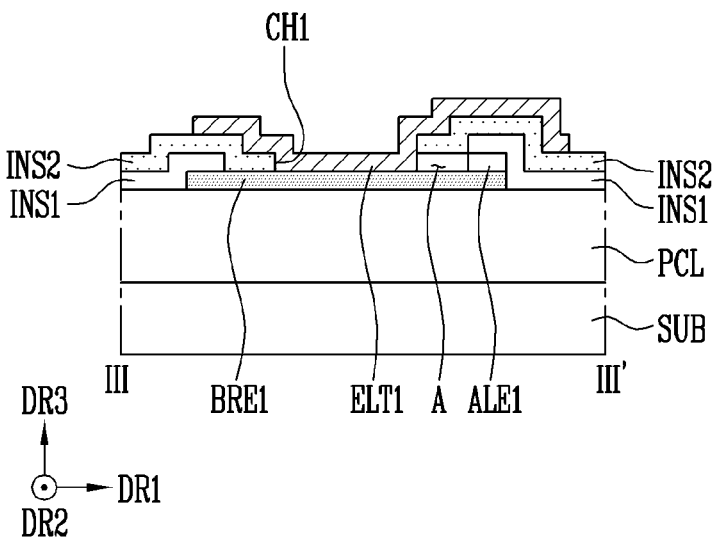

FIG. 18F is a schematic sectional view corresponding to line III-III' of FIG. 17F. FIG. 18G is a schematic sectional view corresponding to line III-III' of FIG. 17G. FIG. 18H is a schematic sectional view corresponding to line III-III' of FIG. 17H.

Hereinafter, with reference to FIGS. 17A to 17H and 18A to 18H, based on the first connection electrode BRE1, the first alignment electrode ALE1, and the first pixel electrode ELT1 that are disposed in the second opening OP2 of the bank BNK, disposition and/or connection relationship between the foregoing components will be sequentially described according to the fabrication method.

Herein, there is illustrated the case where the steps of fabricating the display device are sequentially performed according to the plan views and the sectional views, but without changing the spirit of the disclosure, some steps illustrated as being successively performed may be simultaneously performed, the sequence of the steps may be changed, some steps may be skipped, or another step may be further included between the steps.

Referring to FIGS. 6, 14 to 16, 17A, and 18A, the first conductive layer including the first connection electrode BRE1 may be formed on a surface of the pixel circuit layer PCL. The second conductive layer including the first alignment electrode ALE1 may be formed on the first conductive layer (or the first connection electrode BRE1). The first conductive layer may include the second connection electrode BRE2 spaced apart from the first connection electrode BRE1. The second conductive layer may include the second alignment electrode ALE2 spaced from the first alignment electrode ALE1.

The first connection electrode BRE1 may be formed of a transparent conductive material (or substance) such as indium tin oxide (ITO), and indium zinc oxide (IZO). The first alignment electrode ALE1 may be formed of an opaque conductive material including metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof.

The material for forming the first connection electrode BRE1 and the first alignment electrode ALE1 is not limited to the foregoing embodiment, and the first connection electrode BRE1 and the first alignment electrode ALE1 may include different materials. For example, the first alignment electrode ALE1 (or the first upper electrode) may be formed of material having a relatively high sidewall etching rate in a wet etching process, compared to that of the first connection electrode BRE1 (or the first lower electrode). Furthermore, the first alignment electrode ALE1 (or the first upper electrode) may be formed of material that is easily oxidized when exposed to the air, compared to that of the first connection electrode BRE1 (or the first lower electrode).

In an embodiment, before the first conductive layer is formed on the pixel circuit layer PCL, the bank pattern BNP for providing space in which the light emitting elements LD are to be disposed (or aligned) may be formed at least in the emission area EMA of the pixel PXL.

Referring to FIGS. 6, 14 to 16, 17A, 17B, 18A, and 18B, a primary etching process (e.g., a wet etching process) may be performed so that an area (or referred also to as "portion") of the first alignment electrode ALE1 may be removed, and the first connection electrode BRE1 disposed thereunder may be exposed to the outside. The area of the first alignment electrode ALE1 that corresponds to the first contact hole CH1 of the second insulating layer INS2 that is to be formed during a subsequent process may be removed.

During the foregoing primary etching process, an area (or referred also to as "portion") of the second alignment electrode ALE2 (or the second upper electrode) may be removed so that the second connection electrode BRE2 (or the second lower electrode) disposed thereunder may be exposed to the outside. The area of the second alignment electrode ALE2 that corresponds to the second contact hole CH2 of the second insulating layer INS2 that is to be formed during a subsequent process may be removed.

Referring to FIGS. 6, 14 to 16, 17A to 17C, and 18A to 18C, the first insulating material layer INSM1 may be formed on the first alignment electrode ALE1 the one area of which is removed and the first connection electrode BRE1 that is exposed. The first insulating material layer INSM1 may be formed of an inorganic insulating layer (or an inorganic layer) including an inorganic material or an organic insulating layer (or an organic layer) including an organic material, as base material for forming the first insulating layer INS1.

During the foregoing process, as the first insulating material layer INSM1 is disposed over the first alignment electrode ALE1 and the first connection electrode BRE1, the first alignment electrode ALE1 may be covered with the first insulating material layer INSM1, so that oxidization of the first alignment electrode ALE1 resulting from exposure during the fabrication process may be prevented or mitigated.

Referring to FIGS. 6, 14 to 16, 17A to 17D, and 18A to 18D, a photolithography process using a mask may be performed to form the first insulating layer INS1 from which the first connection electrode BRE1 and the first alignment electrode ALE1 are exposed. At least in the emission area EMA, the first connection electrode BRE1 and the first alignment electrode ALE1 may be completely covered with the first insulating layer INS1.

After the process of forming the first insulating layer INS1, the bank BNK may be formed on the first insulating layer INS1 disposed in the non-emission area NEMA of the pixel PXL. The process of forming the bank BNK is not limited to the foregoing embodiment. In an embodiment, the bank BNK and the bank pattern BNP may be formed by a same process. In this case, the bank BNK and the bank pattern BNP may be integrally provided and electrically connected to each other, and the first insulating layer INS1 may be disposed on the bank BNK.

After the bank BNK is formed on the first insulating layer INS1, a process of aligning the light emitting elements LD in the emission area EMA may be performed. For example, the light emitting elements LD may be supplied (or fed) to the emission area EMA by an inkjet printing method. In detail, a nozzle of an inkjet printing device may be disposed over the emission area EMA enclosed by the bank BNK, and a solution (or a mixed solution) formed of (or including) a solvent and light emitting elements LD included (or dispersed) in the solvent may be supplied (or input) to the emission area EMA. The first to fourth alignment electrodes ALE1, ALE2, ALE3, and ALE4 may be supplied with corresponding alignment signals, so that an electric field may be formed between the first to fourth alignment electrodes ALE1, ALE2, ALE3, and ALE4. Due to the electric field, at least in the emission area EMA, the light emitting elements LD may be aligned between the first alignment electrode ALE1 and the third alignment electrode ALE3 and between the second alignment electrode ALE2 and the fourth alignment electrode ALE4.

Referring to FIGS. 6, 14 to 16, 17A to 17E, and 18A to 18E, the second insulating material layer INSM2 may be formed on the first insulating layer INS1, the first connection electrode BRE1, and the first alignment electrode ALE1. The second insulating material layer INSM2 may be formed of an inorganic insulating layer (or an inorganic layer) including an inorganic material or an organic insulating layer (or an organic layer) including an organic material, as base material for forming the second insulating layer INS2.

Referring to FIGS. 6, 14 to 16, 17A to 17F, and 18A to 18F, an area of the second insulating material layer INSM2 may be removed by performing a photolithography process using a mask so that the second insulating layer INS2, including the first contact hole CH1 by which each of a portion of the first connection electrode BRE1 and a portion of the first alignment electrode ALE1 is exposed, may be formed. Furthermore, the second insulating layer INS2 may include the second contact hole CH2 by which each of a portion of the second connection electrode BRE2 and a portion of the second alignment electrode ALE2 is exposed.

In a plan view, based on the first contact hole CH1, the first connection electrode BRE1 and the first alignment electrode ALE1 may be respectively disposed in two parts of the first contact holes CH1 that are divided from each other. In other words, the first connection electrode BRE1 and the first alignment electrode ALE1 may be exposed to the outside through the first contact hole CH1 of the second insulating layer INS2. Based on the first contact hole CH1, a boundary BD may be present between the first connection electrode BRE1 and the first alignment electrode ALE1. However, the disclosure is not limited thereto. Depending on a shape in which a portion of the first alignment electrode ALE1 is removed by the above-described primary etching process, the number of boundaries BD between the first connection electrode BRE1 and the first alignment electrode ALE1 based on the first contact hole CH1 may be at least one or more and three or less.

The second insulating layer INS2 may be formed in the form of an individual pattern which is provided on an upper surface of each of the light emitting elements LD at least in the emission area EMA.

Referring to FIGS. 6, 14 to 16, 17A to 17G, and 18A to 18G, a secondary etching process may be performed to completely remove the portion of the first alignment electrode ALE1 that is exposed through the first contact hole CH1, so that the first connection electrode BRE1 disposed thereunder may be exposed. In other words, due to the above-described secondary etching process, only the first connection electrode BRE1 may remain in an area of the pixel area PXA that corresponds to the first contact hole CH1, and may be exposed to the outside.

Since the first alignment electrode ALE1 is formed of a conductive material having a relatively high sidewall etching rate, the sidewall thereof is excessively etched by the secondary etching process, so that the sidewall is spaced apart from a boundary of the first contact hole CH1 by a predetermined distance d. However, the disclosure is not limited thereto. In an embodiment, the sidewall of the first alignment electrode ALE1 may corresponds to the boundary of the first contact hole CH1.

During the secondary etching process, the portion of the second alignment electrode ALE2 that is exposed through the second contact hole CH2 may be completely removed, so that the second connection electrode BRE2 disposed thereunder may be exposed. In other words, due to the secondary etching process, only the second connection electrode BRE2 may remain in an area of the pixel area PXA that corresponds to the second contact hole CH2, and may be exposed to the outside.

Next, referring to FIGS. 6, 14 to 16, 17A to 17H, and 18A to 18H, the first pixel electrode ELT1 is formed on the second insulating layer INS2. In the second opening OP2, the first pixel electrode ELT1 may be disposed on the first connection electrode BRE1 exposed through the first contact hole CH1 and be electrically connected to the first connection electrode BRE1. In other words, the first pixel electrode ELT1 may directly contact the first connection electrode BRE1 exposed through the first contact hole CH1. The first pixel electrode ELT1 may be electrically connected with the first alignment electrode ALE1 by the first connection electrode BRE1. During a process of forming the first pixel electrode ELT1, a space A enclosed by the second insulating layer INS2, the first alignment electrode ALE1, and the first pixel electrode ELT1 may be formed.

During the foregoing process, the second pixel electrode ELT2 may be formed on the second insulating layer INS2 on the second alignment electrode ALE2. In the second opening OP2, the second pixel electrode ELT2 may be disposed on the second connection electrode BRE2 exposed through the second contact hole CH2 and be electrically connected to the second connection electrode BRE2. In other words, the second pixel electrode ELT2 may directly contact the second connection electrode BRE2 exposed through the second contact hole CH2. The second pixel electrode ELT2 may be electrically connected with the second alignment electrode ALE2 by the second connection electrode BRE2.

During the above-mentioned fabrication process, the first pixel electrode ELT1 may directly contact the first connection electrode BRE1 (or the first lower electrode) exposed through the first contact hole CH1 of the second insulating layer INS2, and the second pixel electrode ELT2 may directly contact the second connection electrode BRE2 (or the second lower electrode) exposed through the second contact hole CH2 of the second insulating layer INS2.

Therefore, even if while the above-mentioned fabrication process is performed, the first and second alignment electrodes ALE1 and ALE2 are exposed to the outside for a predetermined time or more and thus oxidized, in lieu of the first and second alignment electrodes ALE1 and ALE2, the first and second connection electrodes BRE1 and BRE2 disposed thereunder may directly contact the first and second pixel electrodes ELT1 and ELT2, so that the contact resistance of the first and second pixel electrodes ELT1 and ELT2 may be prevented from increasing. Consequently, the reliability of the first and second pixel electrodes ELT1 and ELT2 may be enhanced, so that the light emitting elements LD may be more reliably driven, whereby the reliability of the display device may be improved.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure. The scope of the claimed invention must be defined by the accompanying claims.

What is claimed is:

1. A display device comprising:
   a plurality of pixels, each of the plurality of pixels comprising:
      a first lower electrode and a second lower electrode disposed on a substrate and spaced apart from each other;
      a first upper electrode disposed on the first lower electrode;

a second upper electrode disposed on the second lower electrode and spaced apart from the first upper electrode;

a first insulating layer defining:
  a first contact hole exposing a portion of the first lower electrode; and
  a second contact hole exposing a portion of the second lower electrode;

a first pixel electrode disposed on the first insulating layer in a thickness direction that is perpendicular to width and length directions of the substrate, and directly contacting the first lower electrode through the first contact hole;

a second pixel electrode disposed on the first insulating layer in the thickness direction, and directly contacting the second lower electrode through the second contact hole; and a light emitting element disposed between the first upper electrode and the second upper electrode, wherein the first pixel electrode is electrically connected with the first upper electrode through the first lower electrode, and wherein the second pixel electrode is electrically connected with the second upper electrode through the second lower electrode.

2. The display device according to claim 1, wherein the first upper electrode is disposed directly on the first lower electrode, and
  wherein the second upper electrode is disposed directly on the second lower electrode.

3. The display device according to claim 2, wherein the first lower electrode and the first upper electrode have a same shape in a plan view except for an area corresponding to the first contact hole, and
  wherein the second lower electrode and the second upper electrode have a same shape in a plan view except for an area corresponding to the second contact hole.

4. The display device according to claim 3, wherein the first lower electrode is exposed by an opening of the first upper electrode in the area corresponding to the first contact hole, and
  wherein the second lower electrode is exposed by an opening of the second upper electrode in the area corresponding to the second contact hole.

5. The display device according to claim 1, wherein the first lower electrode and the second lower electrode include a same material, and
  wherein the first upper electrode and the second upper electrode include a material that is different from the material of the first lower electrode and the second lower electrode.

6. The display device according to claim 5, wherein the first and the second lower electrodes include a transparent conductive material, and
  wherein the first and the second pixel electrodes include a material identical to the material of the first and the second lower electrodes.

7. The display device according to claim 6, wherein the first and the second upper electrodes include an opaque conductive material.

8. The display device according to claim 1, wherein each of the plurality of pixels further comprises a second insulating layer disposed on the first upper electrode and the second upper electrode, and
  wherein the light emitting element is disposed on the second insulating layer between the first upper electrode and the second upper electrode.

9. A display device comprising:
a plurality of pixels, each of the plurality of pixels comprising:
  a first lower electrode and a second lower electrode disposed on a substrate and spaced apart from each other;
  a first upper electrode disposed on the first lower electrode;
  a second upper electrode disposed on the second lower electrode and spaced apart from the first upper electrode;
  a first insulating layer defining:
    a first contact hole exposing a portion of the first lower electrode; and
    a second contact hole exposing a portion of the second lower electrode;
  a first pixel electrode disposed on the first insulating layer in a thickness direction, and directly contacting the first lower electrode through the first contact hole;
  a second pixel electrode disposed on the first insulating layer in the thickness direction, and directly contacting the second lower electrode through the second contact hole; and
  a light emitting element disposed between the first upper electrode and the second upper electrode,
  wherein the first pixel electrode is electrically connected with the first upper electrode through the first lower electrode,
  wherein the second pixel electrode is electrically connected with the second upper electrode through the second lower electrode, and
  wherein each of the plurality of pixels further comprises:
  an emission area in which the light emitting element is disposed;
  a non-emission area disposed adjacent to the emission area; and
  a bank disposed in the non-emission area, and including:
    a first opening corresponding to the emission area; and
    a second opening and a third opening spaced apart from the first opening.

10. The display device according to claim 9, wherein the first contact hole and the second contact hole are disposed in at least one of the second opening and the third opening.

11. The display device according to claim 10, wherein each of the plurality of pixels further comprises:
  a pixel circuit layer disposed between the substrate and the first and the second lower electrodes, the pixel circuit layer including at least one transistor and at least one power line; and
  a third insulating layer disposed on the at least one transistor and the at least one power line.

12. The display device according to claim 11, wherein the third insulating layer comprises:
  a first contact portion exposing a portion of the at least one transistor; and
  a second contact portion exposing a portion of the at least one power line,
  wherein the first lower electrode is electrically connected with the at least one transistor through the first contact portion, and
  wherein the second lower electrode is electrically connected with the at least one power line through the second contact portion.

13. The display device according to claim 12, wherein the first contact portion and the second contact portion overlap the bank.

14. The display device according to claim 1, wherein each of the plurality of pixels comprises:

a color conversion layer disposed on the light emitting element for converting a first color of light emitted from the light emitting element to a second color of light; and a color filter disposed on the color conversion layer for allowing the second color of light to selectively pass therethrough.

15. A display device comprising:

a plurality of pixels, each of the plurality of pixels comprising:

a first lower electrode and a second lower electrode disposed on a substrate and spaced apart from each other;

a first upper electrode disposed on the first lower electrode;

a second upper electrode disposed on the second lower electrode and spaced apart from the first upper electrode;

a first insulating layer defining:

a first contact hole exposing a portion of the first lower electrode; and a second contact hole exposing a portion of the second lower electrode;

a first pixel electrode disposed on the first insulating layer in a thickness direction, and directly contacting the first lower electrode through the first contact hole;

a second pixel electrode disposed on the first insulating layer in the thickness direction, and directly contacting the second lower electrode through the second contact hole; and a light emitting element disposed between the first upper electrode and the second upper electrode, wherein the first pixel electrode is electrically connected with the first upper electrode through the first lower electrode, wherein the second pixel electrode is electrically connected with the second upper electrode through the second lower electrode, wherein each of the plurality of pixels comprises an intermediate electrode disposed between the first pixel electrode and the second pixel electrode, and spaced apart from each of the first pixel electrode and the second pixel electrode, and wherein the intermediate electrode comprises a first intermediate electrode, a second intermediate electrode, and a third intermediate electrode disposed at positions spaced apart from each other.

16. The display device according to claim 15, wherein the first pixel electrode and the second pixel electrode are disposed on a same layer, and wherein at least one of the first intermediate electrode, the second intermediate electrode, and the third intermediate electrode and the first pixel electrode and the second pixel electrode are disposed on a same layer.

17. The display device according to claim 16, wherein the light emitting element comprises:

a first light emitting element disposed between the first pixel electrode and the first intermediate electrode, and electrically connected to the first pixel electrode and the first intermediate electrode;

a second light emitting element disposed between the first intermediate electrode and the second intermediate electrode, and electrically connected to the first intermediate electrode and the second intermediate electrode;

a third light emitting element disposed between the second intermediate electrode and the third intermediate electrode, and electrically connected to the second intermediate electrode and the third intermediate electrode; and a fourth light emitting element disposed between the third intermediate electrode and the second pixel electrode, and electrically connected to the third intermediate electrode and the second pixel electrode.

18. An electronic device comprising the display device according to claim 1.

* * * * *